(12) United States Patent
Moriya et al.

(10) Patent No.: US 6,991,950 B2
(45) Date of Patent: Jan. 31, 2006

(54) METHOD FOR FABRICATING SEMICONDUCTOR LASER ELEMENT AND THE SAME LASER ELEMENT

(75) Inventors: Hiroshi Moriya, Chiyoda (JP); Kisho Ashida, Chiyoda (JP); Toshinori Hirataka, Yokohama (JP); Mamoru Morita, Hiratsuka (JP)

(73) Assignees: Hitachi, Ltd., Tokyo (JP); OpNext Japan, Inc, Yokohama (JP)

( * ) Notice: Subject to any disclaimer, the term of this patent is extended or adjusted under 35 U.S.C. 154(b) by 361 days.

(21) Appl. No.: 10/358,175

(22) Filed: Feb. 5, 2003

(65) Prior Publication Data
US 2004/0047380 A1    Mar. 11, 2004

(30) Foreign Application Priority Data
Aug. 29, 2002   (JP)   .............................. 2002-249886

(51) Int. Cl.
*H01L 21/00*   (2006.01)
(52) U.S. Cl. ............................ 438/22; 438/31; 438/35; 438/39
(58) Field of Classification Search .................. 438/22, 438/29, 31, 32, 35, 36, 37, 39; 372/46
See application file for complete search history.

(56) References Cited

U.S. PATENT DOCUMENTS

| | | | | |
|---|---|---|---|---|
| 5,496,767 A | * | 3/1996 | Yoshida | ........................ 117/89 |
| 6,370,176 B1 | * | 4/2002 | Okumura | ...................... 372/45 |
| 6,858,877 B2 | * | 2/2005 | Kawaguchi et al. | .......... 257/97 |

FOREIGN PATENT DOCUMENTS

| | | |
|---|---|---|
| JP | 07-226563 | 8/1995 |
| JP | 10-117040 | 5/1998 |
| JP | 2000-100728 | 4/2000 |

* cited by examiner

*Primary Examiner*—Tuan H. Nguyen
(74) *Attorney, Agent, or Firm*—Antonelli, Terry, Stout and Kraus, LLP.

(57) ABSTRACT

There is provided a semiconductor laser element which can change band gap wavelengths without change of composition of a multiple quantum well active layer and a method for fabricating a semiconductor laser module. In the method for fabricating a semiconductor laser element wherein a multiple quantum well active layer is formed on a semiconductor substrate with a crystal growth method, an insulation film is formed at the upper part of the multiple quantum well active layer, an electrode film is moreover formed on the insulation film and at least a part of the electrode film is electrically connected to the multiple quantum well active layer, distortion of the multiple quantum well active layer is controlled in the semiconductor laser element fabrication process after the process of the crystal growth method.

7 Claims, 19 Drawing Sheets

END FACE 12

DISTRIBUTION OF DISTORTION GENERATED IN ACTIVE LAYER

END FACE 12

DISTRIBUTION OF DISTORTION GENERATED IN ACTIVE LAYER

END FACE

DISTRIBUTION OF DISTORTION GENERATED IN ACTIVE LAYER

METHOD FOR FABRICATING SEMICONDUCTOR LASER ELEMENT AND THE SAME LASER ELEMENT

FIELD OF THE INVENTION

The present invention relates to a semiconductor laser element.

BACKGROUND OF THE INVENTION

In a multiple wavelength transmission system, a plurality of semiconductor laser elements having different band gaps are required. A semiconductor laser element is fabricated by forming, on a semiconductor substrate, a multiple quantum well active layer corresponding to the desired band gap wavelength. This multiple quantum well active layer is formed through crystal growth of a compound semiconductor on the substrate with the metal organic chemical vapor deposition (hereinafter described as MOCVD) method.

Therefore, for example, the Japanese Patent Laid-open No. 226563/1995 and Japanese Patent Laid-open No. 117040/1998 describe that a plurality of pairs of striped insulation film mask including interval of constant width are formed to the position where an optical waveguide path is formed and an optical waveguide path active layers of different film thickness and composition are formed thereto by changing the width of this stripe. Moreover, for example, the Japanese Patent Laid-open No. 100728/2000 describes that a plurality of active layers are formed by radiating heat ray having intensity distribution to a substrate when an active layer is formed with the MOCVD method.

However, the fabrication method described above is required, in order to obtain laser elements having different band gap wavelengths, to fabricate an element by preparing for a wafer where composition of active layer is different for every specification of band gap wavelength and therefore this method results in increase of fabrication cost.

SUMMARY OF THE INVENTION

Therefore, an object of the present invention is to provide a method for fabricating a semiconductor laser elements which can control an oscillation wavelength even without changing composition of an active layer and a method for fabricating a semiconductor laser modules.

The present invention is provided with following configuration to overcome the object described above.

(1) A method for fabricating a semiconductor laser element comprises the steps of providing a semiconductor substrate, forming an active layer having a first composition to oscillate laser beam to the semiconductor substrate, and forming an electrode film over the active layer, wherein the method further comprises the step of controlling, after the step of forming the active layer, distortion of the active layer so that the active layer has distortion determined corresponding to an oscillation wavelength.

Therefore, there can be provided a semiconductor laser element which can maintain higher oscillation efficiency to attain the desired wavelength by controlling distortion of active layer even when the composition of active layer is not changed depending on oscillation wavelength.

In a method for fabricating a semiconductor laser element, a multiple quantum well active layer is formed on the semiconductor substrate with a crystal growth method, an insulation film is formed over the multiple quantum well active layer, an electrode film is further formed on the insulation film, and at least a part of the electrode film is electrically connected to the multiple quantum well active layer. In this method, distortion of the multiple quantum well active layer is controlled in the semiconductor laser element fabrication process conducted after the crystal growth method.

Since there is the step of controlling distortion after formation of active film, amount of distortion can be controlled easily because it is no longer required to provide members of different compositions for each wavelength which has been required for controlling wavelength by changing composition of the substrate and other films before formation of active layer.

(2) A method for fabricating a semiconductor laser element comprises the steps of providing a semiconductor substrate, forming an active layer having a first composition to oscillate laser beam to the semiconductor substrate, forming a projecting mesa-configuration projected from the circumference on the active layer, forming an electrode film having tensile stress to an area including the upper surface of the mesa-configuration, wherein the step of forming the electrode film includes a step of forming the electrode film in the thickness predetermined corresponding to an oscillation wavelength.

As described above, distortion of the active layer is controlled with thickness of the electrode film having stress. Therefore, stress of electrode film is controlled by controlling thickness thereof.

(3) A method for fabricating a semiconductor laser element is characterized in that the step of forming the insulation film having stress in place of electrode film includes a step of forming the insulation film in the thickness predetermined corresponding to oscillation wavelength. Therefore, distortion of the active layer is controlled with thickness of the insulation film having stress. It is also possible to control thickness of both electrode film and insulation film.

(4) A method for fabricating a semiconductor laser element comprises the steps of providing a semiconductor substrate, forming an active layer having a first composition to oscillate laser beam to the semiconductor substrate, forming a projecting mesa-configuration projected from the circumference on the active layer, forming insulation films at the positions sandwiching the mesa-configuration from both sides, forming a distortion control film on the insulation film, and forming an electrode film having tensile stress to an area including the upper surface of the mesa-configuration part and an upper part of the insulation film, wherein the step of forming the distortion control film includes a step of forming this distortion control film in the thickness predetermined corresponding to oscillation wavelength.

Stress of the distortion control film is controlled depending on thickness of the same film with distortion of the multiple quantum well active layer.

(5) A method for fabricating a semiconductor laser module comprises the steps of forming a semiconductor laser element and providing the laser element to a chip carrier via a junction member, wherein the step of forming the semiconductor laser element includes the steps of providing a semiconductor substrate, forming an active layer having a first composition for laser oscillation to the semiconductor substrate, and forming an electrode film over the active layer, and the step of providing the laser element to the chip carrier includes a step of adjusting the providing position to become equal to the distance from the facet of chip carrier predetermined corresponding to oscillation wavelength.

Distortion of active layer of semiconductor laser element is controlled with mounting positions of the semiconductor laser element and chip carrier on a stem.

(6) A method for fabricating a semiconductor laser element is characterized in that the step of mounting the element to the chip carrier includes a step of mounting the element to the chip carrier in the thickness predetermined corresponding to oscillation wavelength.

Distortion of active layer of the semiconductor laser element is controlled with thickness of the chip carrier or stem.

(7) A semiconductor laser element is characterized in that thickness of an upper electrode film is twice or more the thickness of a lower electrode.

(8) A semiconductor laser element is characterized in that an upper electrode film is formed in the length of 70% or more of the longitudinal length of the element. It is desirable that at least the electrode is provided within the area of 20% of the length from the center (central area) of the longitudinal direction of the element.

Moreover, it is more preferable that distortion is effectively generated in the central area of the element which give influence on oscillation wavelength by providing an electrode film in the length of 80% or more of the longitudinal length of the element. In addition, it is more preferable for control of deterioration of the facet to locate the facet of the electrode film to the area isolated from the area in the distance of 5% of the longitudinal length from the facet.

(9) A semiconductor laser element is characterized in that an insulation film located between the upper electrode films located at both sides of the mesa-configuration and the active layer and a distortion control film adjacent to the insulation film are provided and the facet of the insulation film is located at the external side of the facet of the distortion control film.

(10) An apparatus for fabricating a plurality of semiconductor laser elements can be realized with the following fabrication method.

The method for fabricating a semiconductor laser elements comprises the steps, as described above, of providing a semiconductor substrate, forming an active layer for laser oscillation on the semiconductor substrate, forming an insulation film in the upper side of the active layer, forming an electrode film to an area including the surface of insulation film on the upper side of the insulation film, and moreover a step of providing a first semiconductor laser element having a first wavelength by forming, on a first semiconductor substrate, an electrode film or an insulation film of a first thickness after forming an active layer of a first composition and a step of providing a second semiconductor laser element having a second wavelength by forming, on a second semiconductor substrate, an electrode film or insulation film of a second thickness which is thicker than the first thickness after forming the active layer of the first composition.

DETAILED DESCRIPTION OF THE PREFERRED EMBODIMENTS

Methods for fabricating semiconductor laser elements of respective embodiments of the present invention and examples of semiconductor laser modules mounting a laser element of the present invention will be described with reference to the accompanying drawings. The present invention is not limited only to profiles disclosed in the preferred embodiments and allows various changes and modifications based on the prior arts.

[Embodiment 1]

Figure 3:
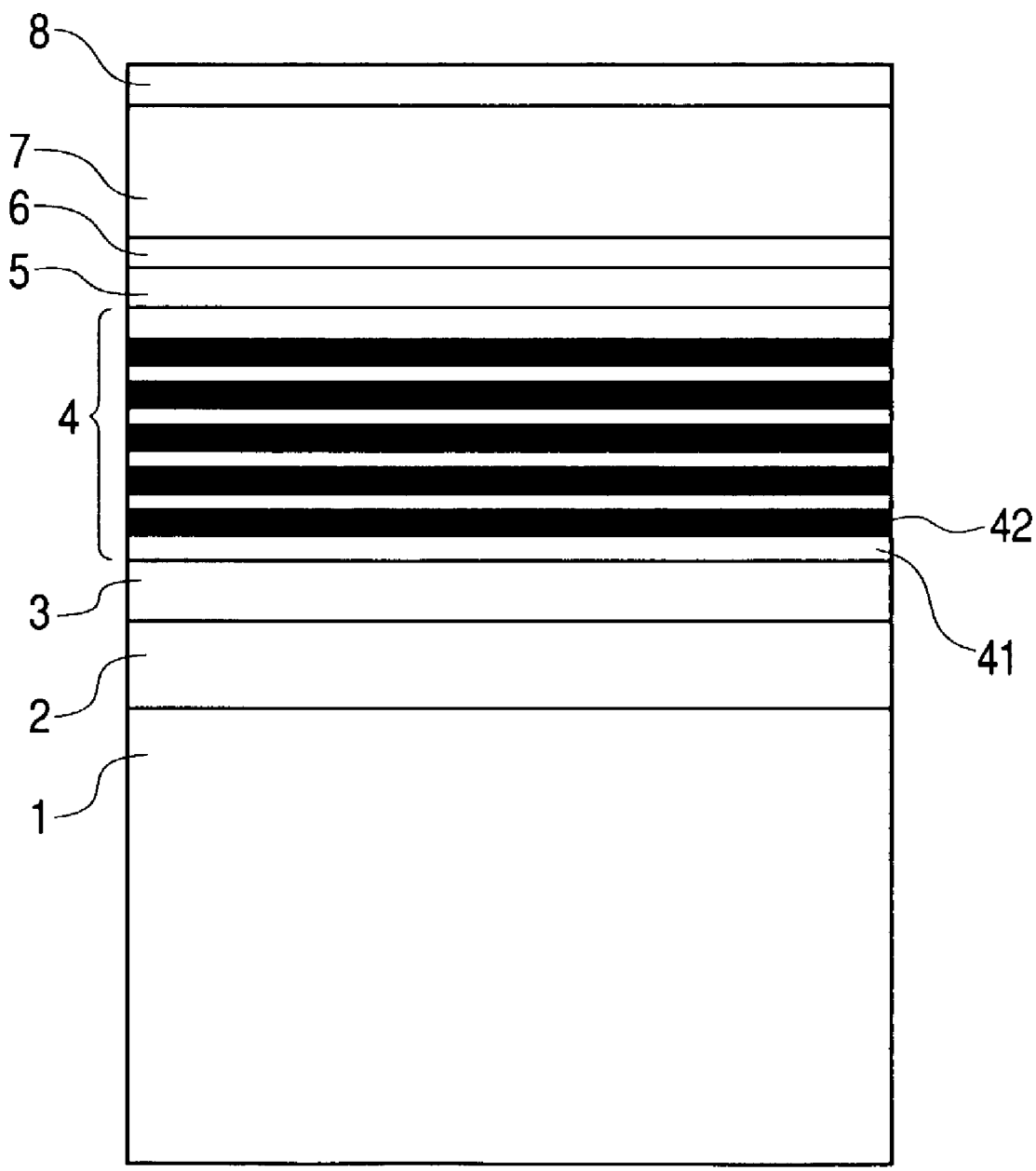
FIG. 3 is a cross-sectional view of a multiple quantum well active layer of the semiconductor laser element of FIGS. 1A, 1B, 1C and FIGS. 2A, 2B, 2C.
Figure 4A:
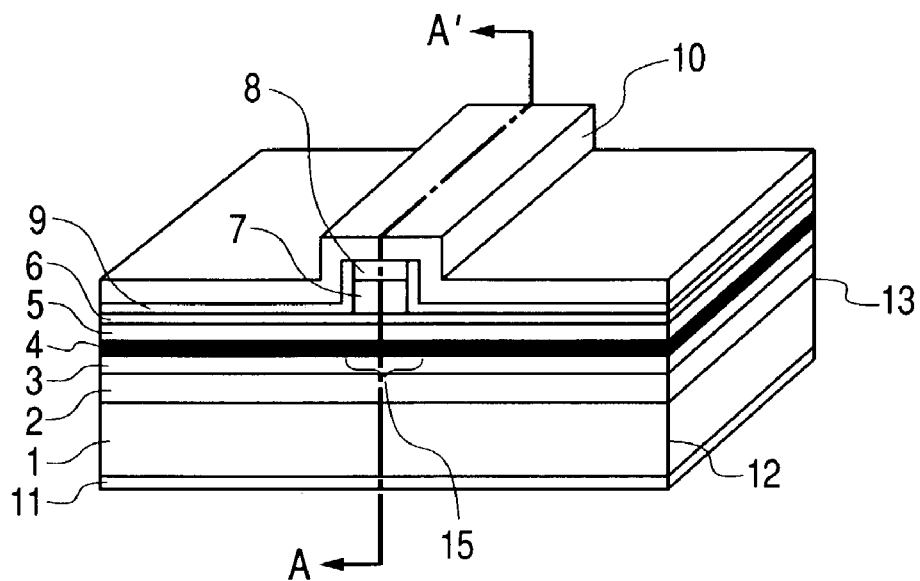
FIG. 4A, FIG. 4B and FIG. 4C are diagrams for describing a distortion distribution of the semiconductor laser element of the first embodiment of the present invention.
Figure 4B:
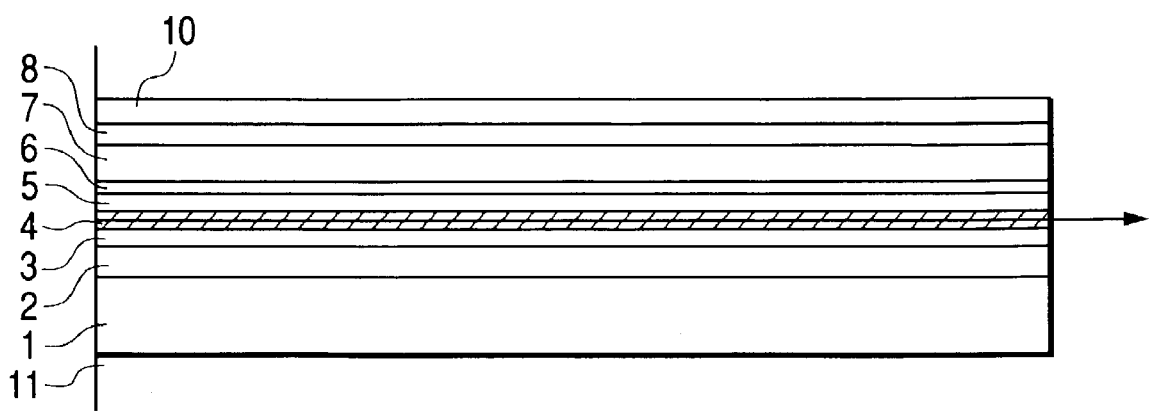
Figure 4C:
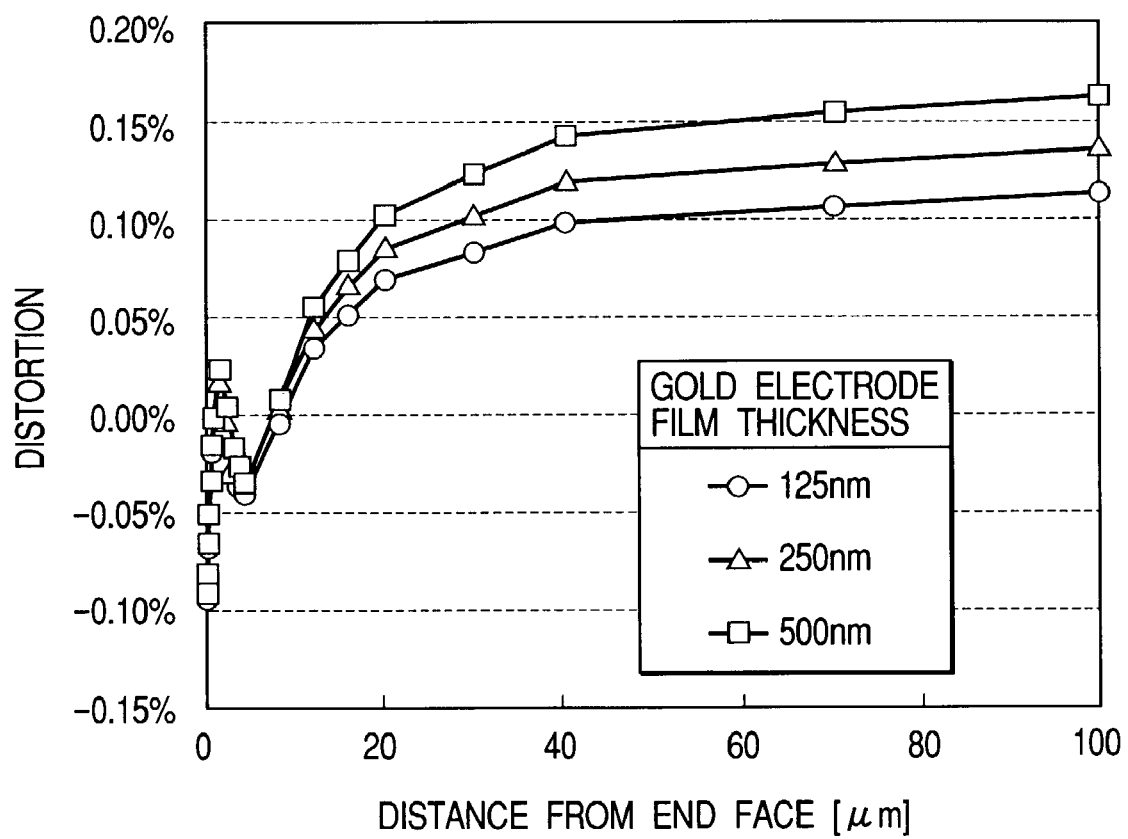
Figure 5:
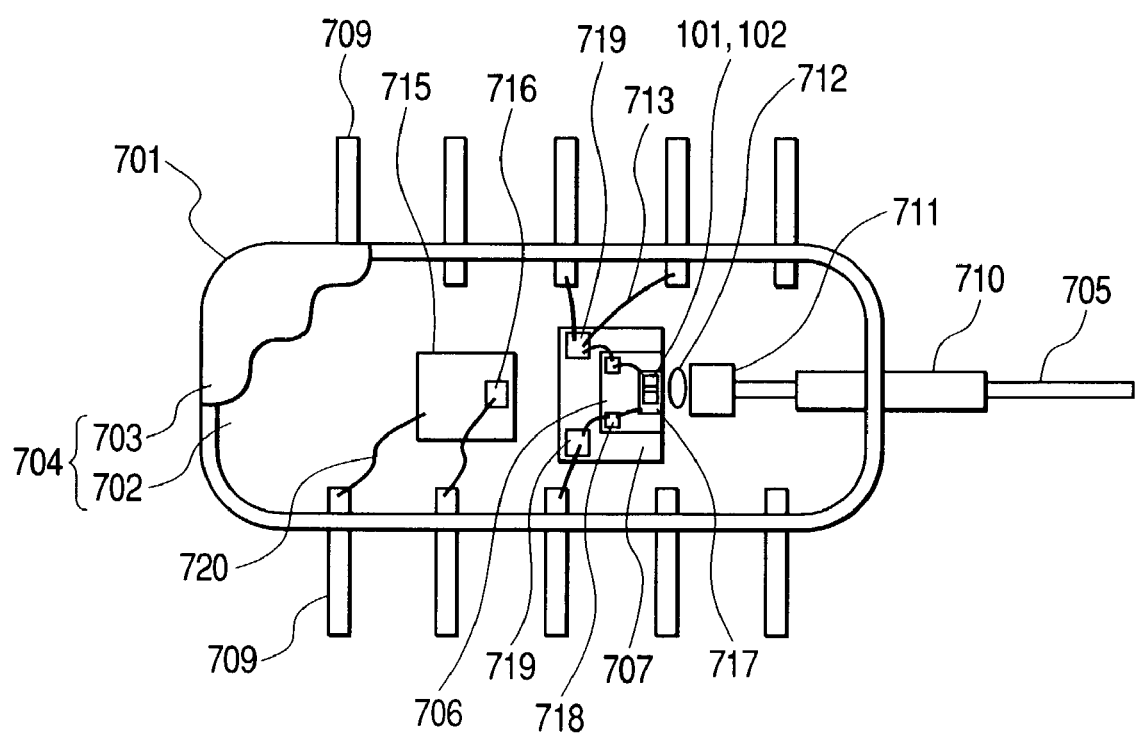
FIG. 5 is a diagram illustrating a configuration of semiconductor laser module of the first embodiment of the present invention.
Figure 6A:
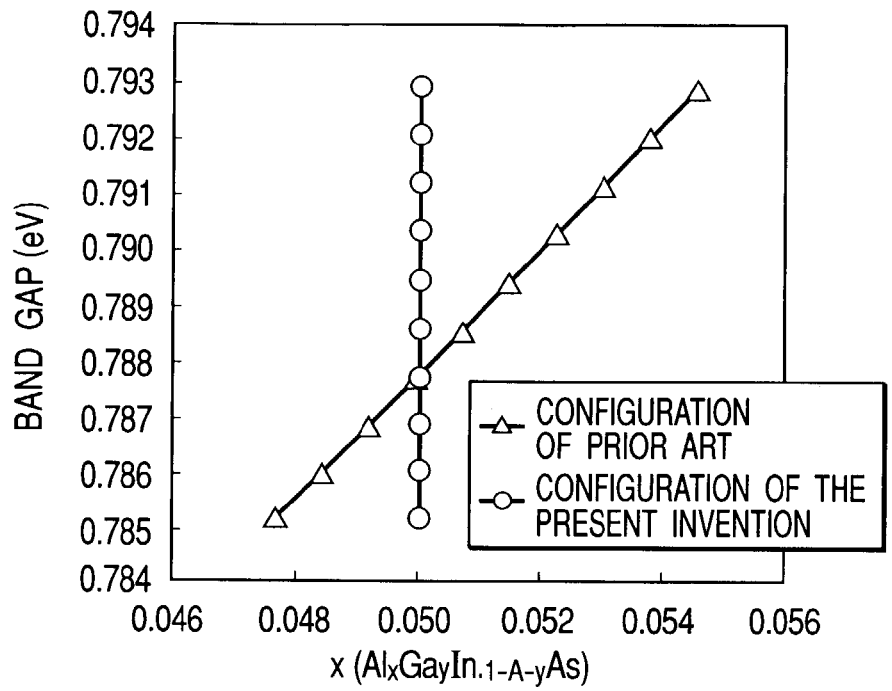
FIG. 6A and FIG. 6B are diagrams illustrating relationships between a composition of active layer of the semiconductor laser element configuration and band gap and between the composition and band gap wavelength, wherein these diagrams are prepared for describing a distortion distribution of a semiconductor laser element of a second embodiment of the present invention.
Figure 6B:
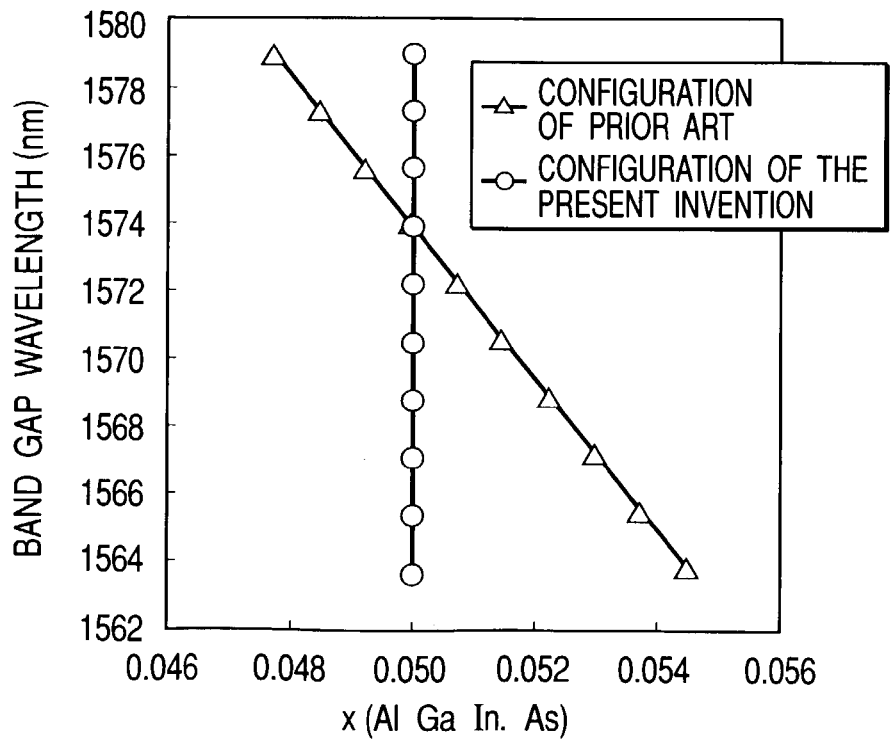

A method for fabricating a semiconductor laser element of a first embodiment of the present invention will be described with reference to FIGS. 1A, 1B, 1C to FIGS. 7A, 7B. FIGS. 1A to 1C and FIGS. 2A to 2C are perspective views of the essential portions illustrating fabrication processes of semiconductor laser element of the first embodiment of the present invention. FIG. 3 is a cross-sectional view of a multiple quantum well active layer (hereinafter referred to as active layer) of the same semiconductor laser element. FIGS. 4A and 4B are perspective view and cross-sectional views of the essential portion of the semiconductor laser element of the present invention. FIG. 4C is a distortion distribution in the active layer at the cross-section along the line A–A' illustrated in FIGS. 4A and 4B. FIG. 5 is a diagram illustrating an example of the semiconductor laser module mounting the semiconductor laser element of the present invention. FIG. 6A is a diagram illustrating relationship between composition of active layer of the semiconductor laser element configuration of the comparison example and the present invention. FIG. 6B is a diagram illustrating relationship between composition of the active layer of the semiconductor laser element configuration and a band gap wavelength of the comparison example and the present invention.

As illustrated in FIG. 5, a semiconductor laser module 701 of this embodiment comprises a package 704 consisting of a package body 702 and a cover body 703 and an optical cable 705 (optical fiber) extended in inside and outside of this package 704. Moreover, a semiconductor laser element 101 or 102 fabricated by the fabrication method described later is fixed to the upper surface at the center of the package body 702 via a chip carrier 706 and a stem 707.

A plurality of electrode terminals 709 are allocated in both sides of the package body 702 to form the package with electrode terminals. These electrode terminals 709 are extended in inside and outside of the package body 702. The optical cable 705 is inserted into a guide pipe 710 which is provided through the package body 702 and is also fixed with a bonding material not illustrated. The end portion of the optical cable 705 is optically connected to an isolator 711. A lens 712 is arranged between this isolator 711 and light emitting surface of a semiconductor laser element 101.

Moreover, the rear surface of the semiconductor laser element 101 or 102 is joined to the chip carrier 706 with a solder material 717 and the semiconductor laser element 101 or 102 is electrically connected to an electrode terminal 709 with a wire 713 via electrode pad 718 or 719.

Further, a photosensitive element 716 is fixed to the package body 702 via the chip carrier 715. An electrode of a photosensitive element 716 and a chip carrier 715 are electrically connected to each electrode terminal via a wire 720.

Next, a method for fabricating the semiconductor laser element of the present invention will be described with reference to FIGS. 1A to 1C, FIGS. 2A to 2C and FIG. 3. The method for fabricating the semiconductor laser element of the present invention enables fabrication of semiconductor laser elements of different wavelengths without change of composition of the active layer.

Figure 1A:
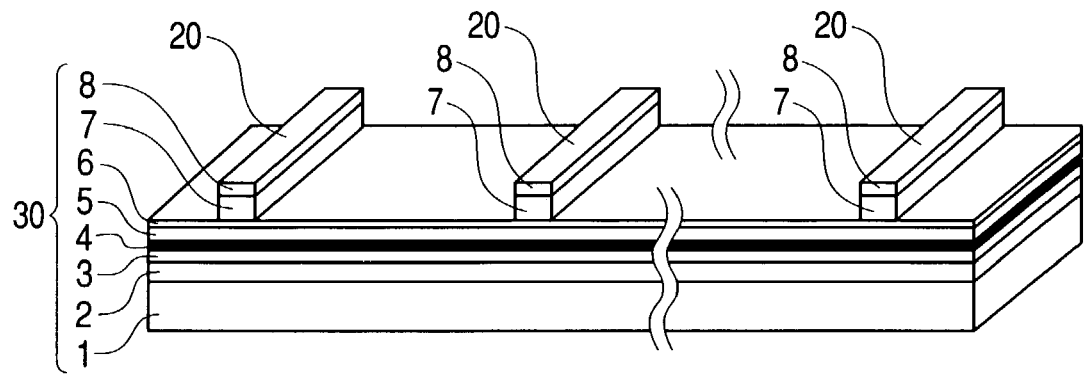
FIG. 1A, FIG. 1B and FIG. 1C are perspective views illustrating a method of fabricating a semiconductor laser element of a first embodiment of the present invention.
Figure 1B:
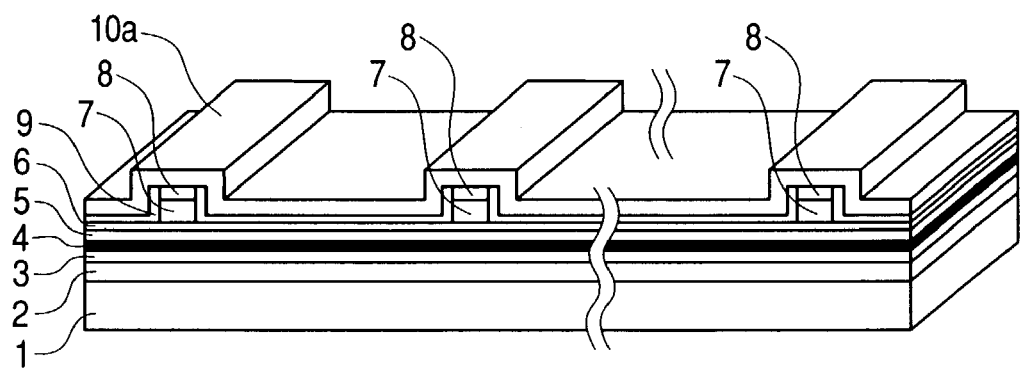
Figure 1C:
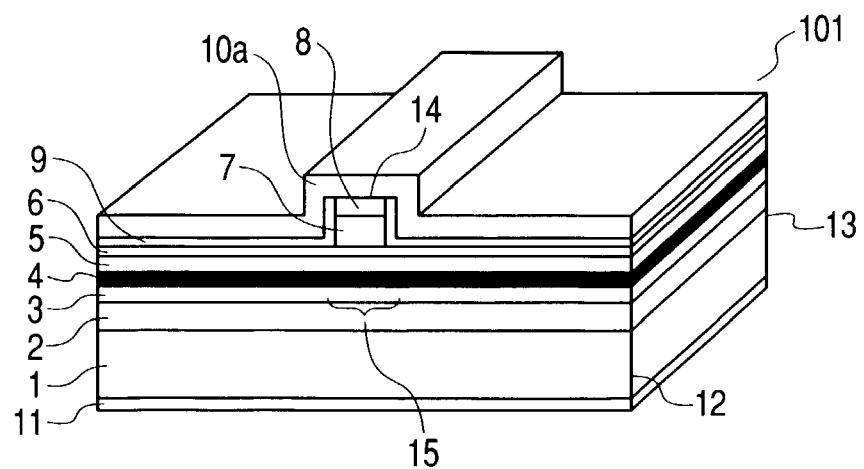

First, in the method for fabricating the semiconductor laser element illustrated in FIGS. 1A to 1C, a buffer layer 2, a first clad layer 3, a multiple quantum well layer 4, a second clad layer 5, an etching stop layer 6, a third clad layer 7 and a cap layer 8 are respectively crystal-grown on a substrate 1 with the metal organic chemical vapor deposition (MOCVD) method in the configurations, as illustrated in FIG. 3, that the substrate 1 is Si-doped n-type InP (thickness is about 500 $\mu$m), the buffer layer 2 is Si-doped n-type InP (thickness is about 1000 nm), the first clad layer 3 is Si-doped InP (thickness is about 2000 nm), the active layer 4 is InGaAlAs multiple quantum well active layer (thickness is about 80 nm), the second clad layer 5 is Zn-doped InP (thickness is about 400 nm), the etching stop layer 6 is InGaAlP (thickness is about 20 nm), the third clad layer 7 is Zn-doped InP (thickness is about 1000 nm), and the cap layer 8 is Zn-doped InGaAsP layer (thickness is about 200 nm). Thereafter, a mesa-configuration 20 (width and height are about 1.6 $\mu$m and 2 $\mu$m, respectively) is formed through the etching process with a resist film used as a mask (FIG. 1A).

Next, an insulation film 9 consisting of silicon oxide film (thickness: 200 nm) is formed, for example, with thermal CVD method. This insulation film 9 is formed extending from the side surface of mesa-configuration (hereinafter referred to as mesa side surface) to the upper surface of the etching stop layer 6 located at a side of the side surface and thereafter the insulation film on the upper surface of mesa-configuration (hereinafter referred to as mesa upper surface) is removed with the etching process.

Thereafter, an electrode film is formed to the upper surface of insulation film and the mesa upper surface 14. As the electrode film 10a, a gold film is formed with the evaporation method in the thickness of 125 nm on under-layers of titanium (thickness: 100 nm) and platinum (thickness: 25 nm). This electrode film 10a is electrically connected to the mesa upper surface 14. Here, the electrode film is formed by the evaporation method in the temperature of 25° C., for example, under the tensile stress of 500 MPa. A metal film formed by the evaporation method has stress (intrinsic stress) which is generated due to difference of line expanding coefficient from that of the under-layer and mismatching of lattice (FIG. 1B). For example, it is described in the reference, ["Thin Film" (published by Shokabo, 1979) written by Kinbara and Fujiwara; p135 to p136] that evaporated iron film and evaporated nickel film has different internal stresses depending on the film forming temperature and annealing temperature. The film used in the semiconductor laser element of the present invention is a evaporated gold film and it is also apparent that the evaporated gold film also generates different internal stresses depending on the film forming temperature and annealing temperature.

Distortion is newly generated in the multiple quantum well active layer 4 when the electrode film 10a having stress is formed on the upper surface of semiconductor crystal part.

Next, the bottom surface of substrate 1 (opposite surface of the semiconductor crystal growth portions 1 to 8) is polished until the substrate thickness is reduced to about 100 to 150 $\mu$m. Thereafter, an electrode 11 (AuGe/Ni/Au, thickness: 100 nm) is formed with evaporation and heat treatment. Further, the semiconductor laser element 101 is vertically cleaved for the longitudinal direction of resonator of the laser (resonator length: 200 $\mu$m) to form a facet (FIG. 1C).

This embodiment can also be applied to crystal growth layer, insulation film and electrode film formed with the method other than that described above.

A protection film not illustrated is formed to the cleaved facets 12, 13 of the semiconductor laser element 101. On the upper surface of one facet 12, a protection film having low reflectivity is formed, while on the upper surface of the other facet 13, a protection film having higher reflectivity is formed. These facet protection films is composed, for example, of aluminum oxide film, silicon nitride film, silicon oxide film, amorphous silicon film, and a laminated film of these films. Here, thickness d of the facet protection film is expressed as d=λ/(4n) for the low reflectivity film when laser oscillation wavelength is defined as λ and refractive index as n, while it is expressed as d=λ/(2n) for the high reflectivity film.

When a current is supplied to an electrode film 11 provided at the rear surface of semiconductor substrate from the electrode film 10a (to the electrode film 11 from the electrode film 10a when a P-type substrate is used), the current almost flows to an active region 15 passing through the mesa upper surface 14 because the electrode film 10a is electrically connected only to the mesa upper surface 14. Electrical energy by this current is converted to an optical signal in the active region 15 of the active layer 13 to generate resonance between the cleaved facets 12 and 13 facing each other. Thereby, a laser beam is emitted from an optical output facet 12 to which the protection film of low reflectivity is formed.

For example, following controls are performed in respective fabrication processes in order to control distortion of the active layer.

In the process to form electrode film and insulation film in which tensile stress is generated, film thickness of electrode film and insulation film is controlled and distortion of active layer are also controlled to bring about distortion corresponding to oscillation wavelength. A semiconductor laser element which oscillates laser beam of longer wavelength can be formed by making small a band gap through increase of film thickness.

Further, in the process to form distortion control film, film thickness of distortion control film is controlled and distortion of active layer is also controlled to bring about distortion corresponding to oscillation wavelength. For instance, when SiN is used as distortion control film, the film generating tensile stress can be used in the same manner as the insulation film. However, in the case of film generating compression stress, a semiconductor laser element which oscillates laser beam of short wavelength can be formed by making a band gap large through increase of film thickness.

As described above, lasers of different thickness which generate various oscillation wavelengths can be formed by utilizing a semiconductor laser element substantially comprising active layer of the same composition.

Here, since wavelength characteristic can be changed even when the composition of the active layer is not changed depending on the oscillation wavelength by controlling the band gap of the central area (area except for the end part of element, central area of element) of active region of active layer, with the stress of the film provided on the upper part of active layer, for example, the insulation film and the electrode film or the like and the stress of distortion control film, the oscillation wavelength can be varied while higher oscillation efficiency is attained. Accordingly, a plurality of semiconductor laser elements comprising the active layers of the same composition and also comprising the electrode films, insulation films or distortion control films of different thickness can provide different oscillation wavelengths. Otherwise, a plurality of semiconductor laser elements comprising the active layers of difference compositions and also comprising the electrode films, insulation films or distortion control films of different thickness can provide different oscillation wavelengths. The same composition used here means the compositions which are equal within the ranges of fabrication error and measurement error.

Moreover, as a result of adjustment of film thickness, a semiconductor laser element of longer wavelength is characterized in that film thickness is thicker than the usual thickness.

For instance, in the case where stress is to be controlled with an electrode film, the thickness of electrode film is set to twice or more the thickness of the lower electrode.

When the electrode film has a multi-layer configuration, it is preferable that thickness of the layer substantially having film stress such as tensile stress or of the main conductive layer having the maximum thickness is compared. For example, when the upper electrode comprises an Au film, a Pt film next to the Au film, and a Ti film next to the Pt film, and the lower electrode is sequentially composed of an Au film, a Pt film, a Ti film, and a Ni film or the like, judgment can be made by comparing thickness of the Au films.

Moreover, adequate distortion is applied to the region including the central area of the element in order to change the wavelength. Accordingly, the upper electrode film is formed to include the central area in the longitudinal direction and to have the length of 70% or more of the longitudinal direction of element.

Further, it is more preferable that an electrode film having the length of 80% or more of the longitudinal direction is provided to effectively apply distortion to the central area of the element which gives influence on oscillation wavelength. In addition, it is preferable to restrain deterioration of facet by locating the facet of the electrode film to the area isolated from the area in the distance of 5% of the longitudinal direction from the facet, namely by providing an area where the electrode film is not formed to the facet.

When it is further requested to control wavelength by controlling the thickness of the insulation film, a configuration where distortion control film of SiN, for example, is deposited on the insulation film is introduced. In this case, the facet of the insulation film is located at the external side of the facet of the distortion control film.

In the semiconductor laser element fabrication steps described above, it is preferable to comprise a step of forming an electrode film or insulation film of a first thickness after formation of an active layer of the predetermined first composition to a certain substrate in order to provide a first semiconductor laser element having a first wavelength and a step of forming an electrode film or insulation film of a second thickness which is thicker than the first thickness after formation of the active layer of the first composition to the substrate in order to provide a second semiconductor laser element having a second wavelength. The second semiconductor laser element particularly has the wavelength which is longer than that of the first semiconductor laser element when the film includes tensile stress. For example, the first semiconductor laser element is formed on a first wafer, while the second semiconductor laser element is formed on a second wafer. After the formation of the element, the wafer is diced.

Otherwise, the first semiconductor laser element is formed in a first area of a certain wafer, while the second semiconductor laser element is formed in a second area of the wafer.

Figure 2A:
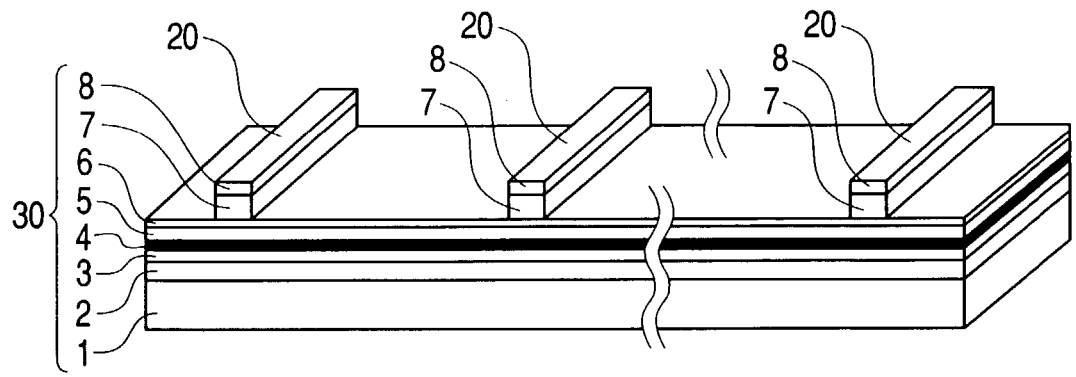
FIG. 2A, FIG. 2B and FIG. 2C are perspective views illustrating the method of fabricating the semiconductor laser element of the first embodiment of the present invention.
Figure 2B:
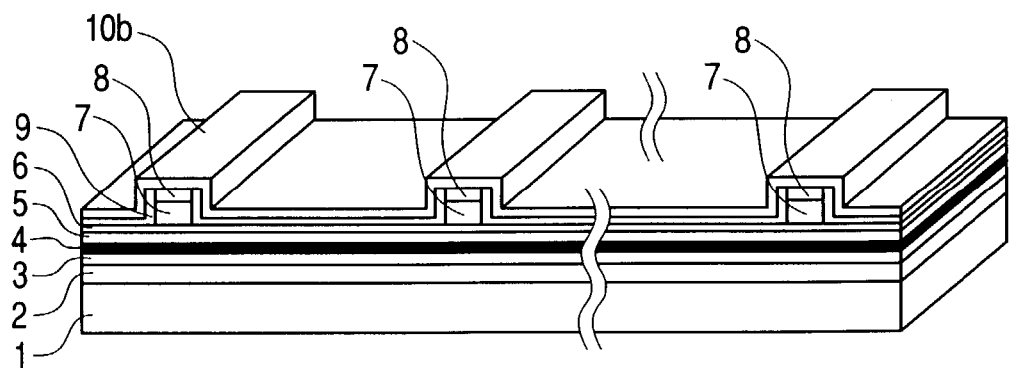
Figure 2C:
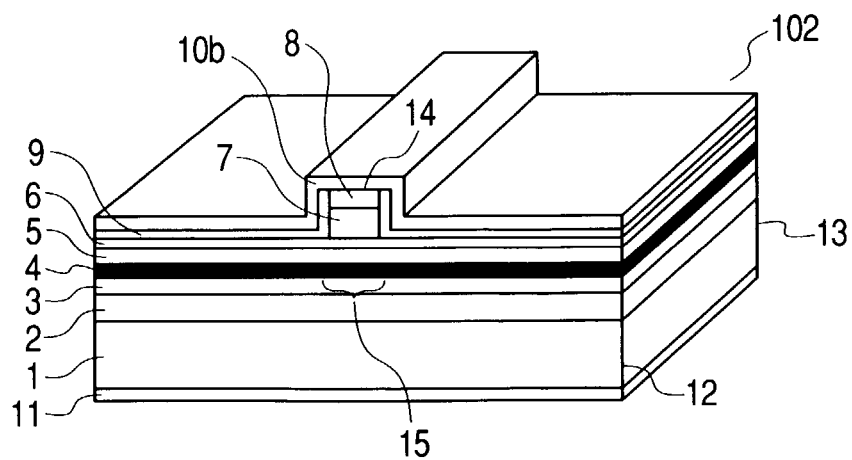

On the other hand, difference from FIGS. 1A to 1C is thickness of electrode films 10a, 10b in the method for fabricating the semiconductor laser element 102 illustrated in FIGS. 2A to 2C. Like FIGS. 1A to 1C, titanium and platinum are used for under-layer film and thickness of the electrode film 10b is set, for example, to 500 nm. In the method for fabricating the semiconductor laser element 102 illustrated in FIG. 2, a crystal growth portion is formed in the same method on the same kind of substrate as FIGS. 1A to 1C and a mesa-configuration is formed with the etching process (FIG. 2A). Next, the insulation film 9 is formed and the electrode film 10b is also formed in the thickness different from the electrode film 10a of semiconductor laser element 101 (FIG. 2B). This electrode film 10b has tensile stress (500 MPa) which is equal to that of the electrode film 10a formed to the semiconductor laser element 101. Accordingly, distribution of distortion which is different from that in the active region 15 of the active layer of the semiconductor laser element 101 is generated in the active region 15 of the active layer of the semiconductor laser element 102.

Next, difference in distributions of distortion generated in the semiconductor laser element 101 and active region 15 of the semiconductor laser element 102 will be described with reference to FIGS. 4A to 4C. FIG. 4A illustrates the semiconductor laser element illustrated in FIG. 1C and FIG. 2B is the cross-sectional view along the line A–A' of FIG. 4A. Moreover, FIG. 4C illustrates results of calculations obtained by analysis with the Finite Element Method (FEM). In FIG. 4C, the horizontal axis indicates distance from the facet indicated with an arrow mark of FIG. 4B. Here, as the material constants used in the FEM analysis, material constants of phosphorus indium (Young's modulus, Poasson's ratio, and line expansion coefficient) are used for the substrate 1, buffer layer 2, first clad layer 3, active layer 4, second clad layer 5, etching stop layer 6, third clad layer 7 and cap layer 8. Actually, the buffer layer 2, clad layers 3, 5, 7, active layer 4, etching stop layer 6, and cap layer 8 are composed of ternary-element or quaternary-element system material but generality of analysis result is never lost even when the material constants of binary-element system phosphorus indium are used as the material constants of the materials listed above. Moreover, analysis has also been performed under the condition that the insulation film 9 has tensile stress of 300 MPa as the initial stress, and the gold electrode films 10a, 10b have tensile stress of 700 MPa, while the insulation film 9 is formed of silicon oxide (thickness: 500 nm), and the electrode is formed of gold deposited over the under-layer of titanium (thickness: 100 nm) and platinum (thickness: 25 nm). The material constants used for FEM analysis are listed in the Table 1. An arrow mark in the Table 1 indicates the same as above.

TABLE 1

| | Young's modulus (Gpa) | Poasson's ratio | Line expansion coefficient (×10⁻⁶/° C.) | Initial stress (MPa) |
|---|---|---|---|---|
| Substrate | 104 | 0.3 | 4.56 | 0 |
| Buffer layer | ↑ | ↑ | ↑ | ↑ |
| First clad layer | ↑ | ↑ | ↑ | ↑ |
| Active layer | ↑ | ↑ | ↑ | ↑ |
| Second clad layer | ↑ | ↑ | ↑ | ↑ |
| Etching stop layer | ↑ | ↑ | ↑ | ↑ |
| Third clad layer | ↑ | ↑ | ↑ | ↑ |
| Insulation film | 70 | 0.17 | 0.6 | 300 |
| Electrode | 82 | 0.3 | 14.2 | 700 |

In FIG. 4C, the horizontal axis represents distance from the facet 12 and the vertical axis represents distortion generated in the active region 15. Here, positive distortion suggests tensile distortion. In FIG. 4C, the results correspond to the configuration where thickness of gold electrode is set to 125 nm, 250 nm and 500 nm.

As is apparent from FIG. 4C, difference is generated in conditions of distortion in the active region 15 due to the difference of thickness of electrode films. Particularly, when the electrode film is thick, it can be understood that distortion generated in the active region within the laser element (inside isolated by about 20 μm or more from the facet) which determines wavelength of the laser beam is shifted toward the tensile side. In general, band gap becomes larger when lattice constant of semiconductor crystal becomes smaller, namely depending on generation of compression distortion in the crystal configuration. In other words, in the case of semiconductor laser elements 101, 102 illustrated in FIG. 1C and FIG. 2C, the band gap becomes smaller in the element having thicker electrode film and moreover the band gap wavelength shifts toward longer wavelength side.

As a result, the band gap wavelength of semiconductor laser element fabricated by the method of the present invention have been 1556 nm (thickness of gold electrode: 125 nm), 1564 nm (thickness of gold electrode: 250 nm) and 1574 nm (thickness of gold electrode: 500 nm).

Next, characteristics of the semiconductor laser element of the present invention will be described with reference to FIGS. 6A and 6B. These figures illustrate relationships between active layer compositions and band gaps (FIG. 6A) in the active layer and band gap wavelengths (FIG. 6B) of a plurality of semiconductor laser elements fabricated by the method of present invention and the other method.

Here, in the example where the method of present invention is not used, when a plurality of semiconductor laser elements having difference wavelengths are fabricated, the band gap is changed by varying composition of the active layer as illustrated in FIG. 6A and the band gap wavelength is changed as illustrated in FIG. 6B. Change of the band gap due to the composition of the active layer is described, for example, in the page 187 of the reference, "III–V Group Compound Semiconductor" by Isamu Akazaki (Advanced Electronics Series) (published by Baifukan). According to this reference, it is described that when $Al_xGa_yIn_{1-x-y}As$ crystal is matched in the lattice with InP, the relationship of $0.98x+y=0.47$ can be established in regard to x and y and the band gap $E_g$ satisfies the relationship of $E^g=0.764+0.495_z+0.203_z^2$ (where, $z=0.48x$).

Figure 7A:
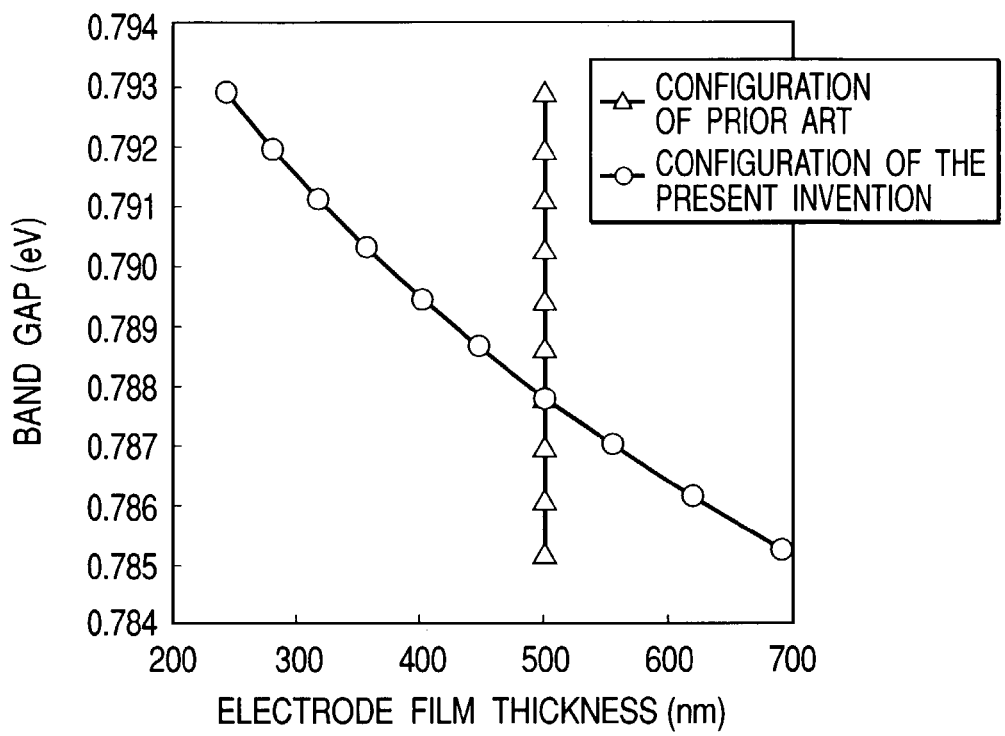
FIG. 7A and FIG. 7B are diagrams illustrating relationships between an electrode film thickness of the semiconductor laser element configuration and band gap of the active layer and between the electrode film thickness and band gap wavelength.
Figure 7B:
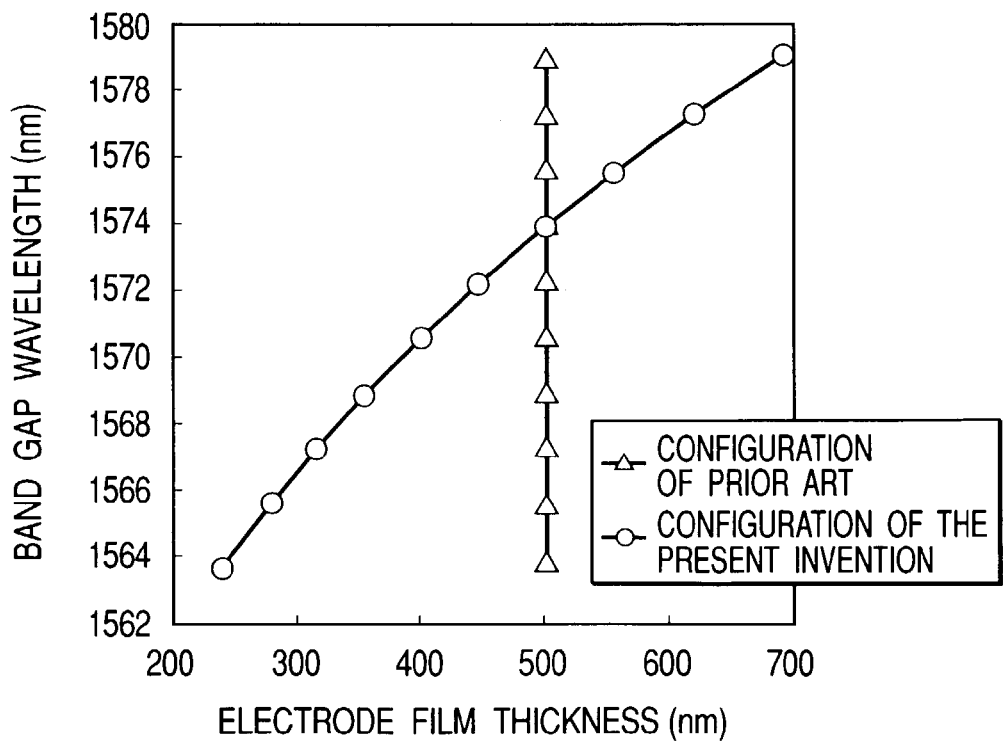

Meanwhile, in the semiconductor laser element in this embodiment, it is not particularly required to change the composition of the active layer in order to change the band gap and the band gap wavelength thereof. The semiconductor laser element in this embodiment has been fabricated with the method described with reference to FIGS. 1A to 1C and FIGS. 2A to 2C and the composition of active layer is same and has different electrode film thickness in a plurality of semiconductor laser elements Namely, the band gap and the band gap wavelength are changed by varying the thickness of the electrode film among a plurality of semiconductor laser elements. Therefore, as illustrated in FIG. 6A and FIG. 6B, there is no particular correlation between the composition of the active layer and the band gap and between the composition of active layer and the band gap wavelength. In order to make clear this point, FIGS. 7A and 7B are illustrated where the band gap and the band gap wavelength indicated in FIGS. 6A and 6B are plotted on the vertical axis and electrode film thickness is plotted on the horizontal axis. As illustrated in these figures, in comparison with a plurality of semiconductor laser element, the semiconductor laser element of this embodiment is same in the composition of active layer but results in a certain correlation between the electrode film thickness and the band gap of the active layer. Moreover, the semiconductor laser element of this embodiment also results in a certain correlation between the electrode film thickness and the band gap wavelength of the active layer.

Namely, according to the method for fabricating the semiconductor laser element of this embodiment, the band gap wavelength can be changed without variation of composition of multiple quantum well active layer and therefore semiconductor laser elements and semiconductor laser modules of different band gap wavelengths can easily be obtained. Therefore, an element which can oscillate laser beam of longer wavelength by making thicker the electrode film of one semiconductor element than that of the other element can be formed from the active layers of same composition. Accordingly, semiconductor lasers of different wavelengths can be provided.

On the occasion of forming a semiconductor laser element in the wavelength of 1570 nm using $Al_xGa_yIn_{1-x-y}As$ crystal (x=0.050) as the substrate, thickness of the electrode film can be calculated by obtaining first $\lambda=1.2/E_g$ ($\lambda$: wavelength; $E_g$: band gap) and $E_g=0.764 +0.495_z+0.203_z^2+El(\epsilon)$ ($El(\epsilon)=A\epsilon$ (formula based on distortion), $z=0.48_x$ and relationship between electrode film thickness (by the finite element method FEM). The calculated film thickness is indicated in FIG. 7B in relation to the band gap and in FIG. 7A in relation to the wavelength. After the relationship between the electrode film thickness and the wavelength is obtained, the film is formed to provide the predetermined wavelength based on such relationship. The example of controlling the electrode film thickness has been described above and the similar steps can also be used for controlling the insulation film or the like.

(Embodiment 2)

Figure 8A:
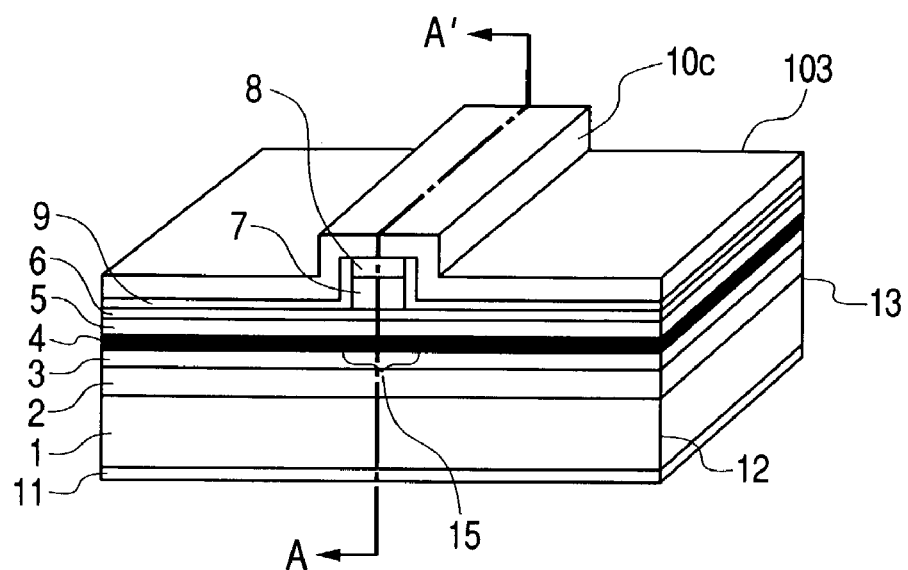
FIG. 8A, FIG. 8B and FIG. 8C are diagrams for describing a distortion distribution of a semiconductor laser element of the second embodiment of the present invention.
Figure 8B:
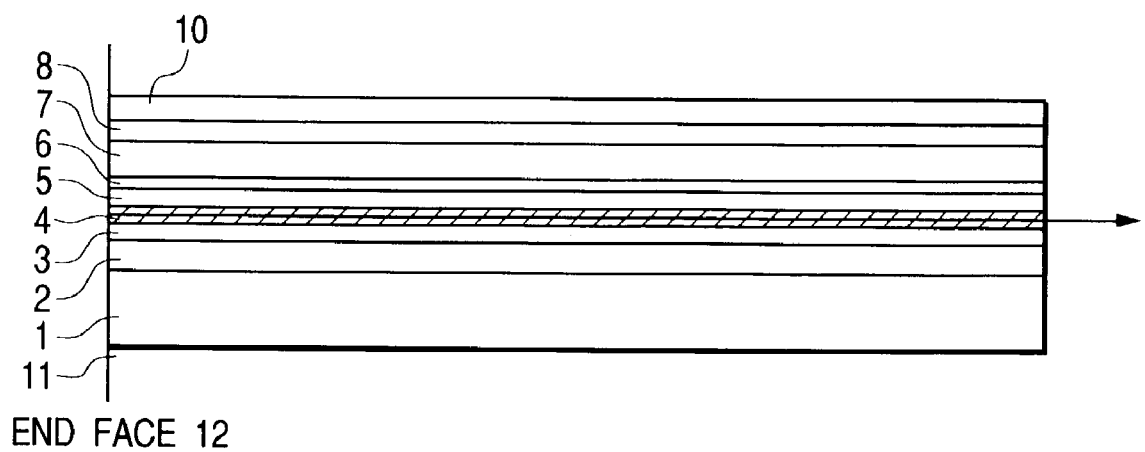
Figure 8C:
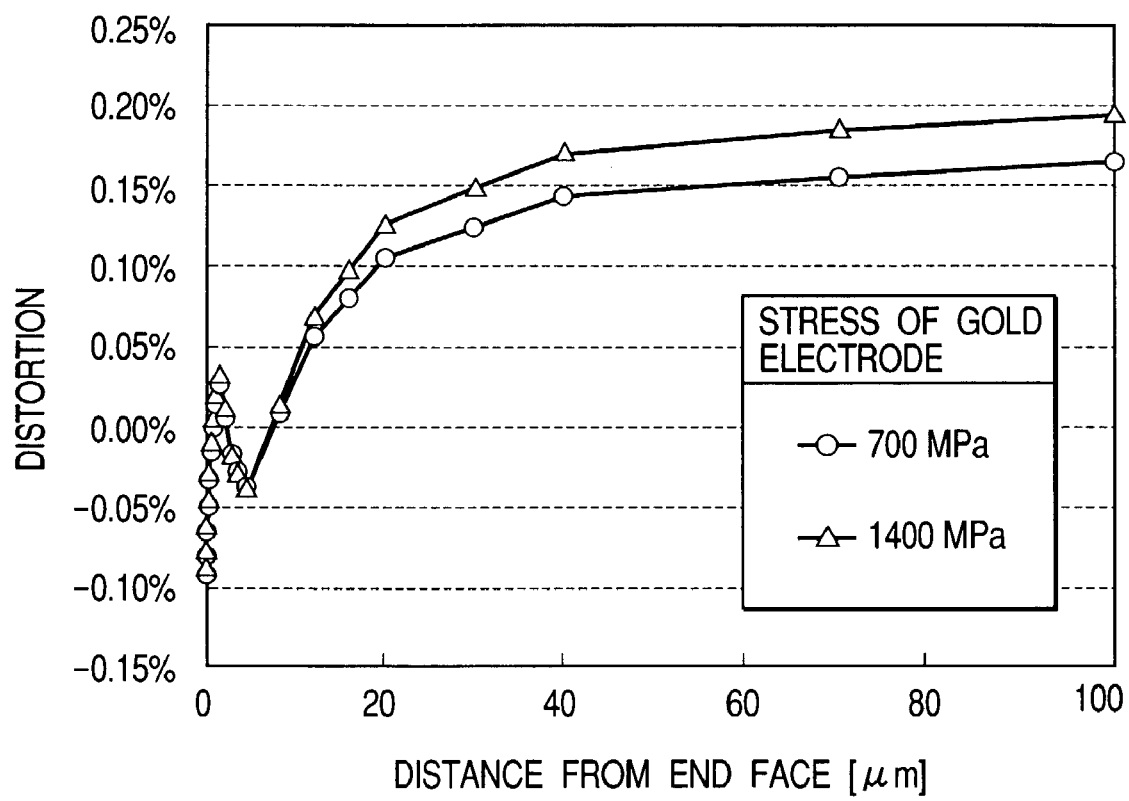

A semiconductor laser element configuration and a method for fabricating the same element of a second embodiment of the present invention will be described with reference to FIGS. 8A to 8C. FIG. 8A is a perspective view illustrating an element obtained the method for fabricating the semiconductor laser element of the second embodiment of the present invention. FIG. 8B is a cross-sectional view along the line A–A' of FIG. 8A and FIG. 8C is a diagram illustrating distribution of distortion of an active layer at the facet along the line A–A' of FIG. 8B.

A method for fabricating a semiconductor laser element of a preferred embodiment of the present invention enables fabrication of semiconductor laser elements of different wavelengths without change of composition of the active layer. Difference between the method for fabricating the semiconductor laser element of this embodiment and the method for fabricating the semiconductor laser element of embodiment 1 is that distortion generated in the multiple quantum well active layer is controlled by varying stress value of the electrode film.

In the semiconductor laser element fabrication processes of the present invention, as illustrated in FIG. 1A, the buffer layer 2, first clad layer 3, multiple quantum well layer 4, second clad layer 5, etching stop layer 6, third clad layer 7 and cap layer are crystal-grown on the substrate 1 with the MOCVD method. Next, a mesa-configuration 8 (width: 1.6 μm; height: about 2 μm) is formed by etching the resist film as the mask. Subsequently, an insulation film 9 consisting of silicon oxide film (thickness: 200 nm) is formed, for example, with the thermal CVD method. This insulation film 9 is formed extending, from the side surface of mesa-configuration (hereinafter referred to as mesa side surface), on the upper surface of etching stop layer 6 located at a side of such side surface and thereafter the insulation film on the upper surface of mesa-configuration (hereinafter referred to as mesa upper surface) is removed by the etching process.

Next, an electrode film 10c is formed on the surface of the insulation film and the mesa upper surface 14. As the electrode film 10c, a gold film (thickness: 500 nm) is formed by evaporation method over the under-layer of titanium (thickness: 100 nm) and platinum (thickness: 25 nm). When gold is evaporated, distortion to be generated in the active layer is controlled, for example, by changing stress generated in the gold electrode film by varying substrate temperature.

For instance, the gold electrode film evaporated under room temperature (20° C.) shows tensile stress of 1000 MPa and the gold electrode film evaporated under 200° C. shows tensile stress of 700 MPa. Namely, distortion is generated in the active region 15 depending on evaporation temperature when the electrode film 10c of different evaporation temperature is formed on the surface of semiconductor crystal. This stress may be lowered by raising the evaporation temperature.

After the formation of the electrode film 10c, the bottom surface of the substrate 1 is polished, an electrode film is formed at the rear surface, a facet is formed by clevage process and a protection film is formed to the facet to form a semiconductor laser element in the same manner as the processes illustrated in FIG. 1A to FIG. 1C (FIG. 5A). Moreover, a semiconductor laser module can be formed by mounting a semiconductor laser element to a package like the semiconductor laser module described as the first embodiment.

This embodiment can also be applied to crystal growth layer, insulation film and electrode film which are formed with the methods other than the method described above.

Next, distribution of distortion generated in the active layer will be described with reference to FIG. 8A to FIG. 8C. FIG. 8C illustrates calculation result obtained by the FEM analysis. Here, as the material constants used for FEM analysis, the material constants of phosphorus indium are used, as in the case of embodiment 1, for the substrate 1, buffer layer 2, first clad layer 3, active layer 4, second clad layer 5, etching stop layer 6, third clad layer and cap layer 8. Actually, the buffer layer 2, clad layers 3, 5, 7, active layer 4, etching stop layer 6 and cap layer 8 are formed of a material of ternary-element or quaternary-element system but generality of analysis result is still never changed even when the material constants of phosphorus indium of binary-element system are used as the material constants described above. Moreover, the insulation film 9 is formed of silicon oxide (thickness: 200 nm) and stress value thereof is defined as tensile stress of 300 MPa. Analysis has also been performed under the condition that gold film is formed as the electrode in the thickness of 500 nm over the under-layer consisting of titanium (thickness: 100 nm) and platinum (thickness: 25 nm) and that the electrode film 10c has two kinds of tensile stresses of 700 MPa and 1400 MPa.

Material constants used for the FEM analysis are listed in the Table 2. In the Table 2, an arrow mark indicates the same as above.

TABLE 2

|  | Young's modulus (Gpa) | Poasson's ratio | Line expansion coefficient (×10⁻⁶/° C.) | Initial stress (MPa) |
| --- | --- | --- | --- | --- |
| Substrate | 104 | 0.3 | 4.56 | 0 |
| Buffer layer | ↑ | ↑ | ↑ | ↑ |
| First clad layer | ↑ | ↑ | ↑ | ↑ |
| Active layer | ↑ | ↑ | ↑ | ↑ |
| Second clad layer | ↑ | ↑ | ↑ | ↑ |
| Etching stop layer | ↑ | ↑ | ↑ | ↑ |
| Third clad layer | ↑ | ↑ | ↑ | ↑ |
| Insulation film | 70 | 0.17 | 0.6 | 300 |
| Electrode 1 | 82 | 0.3 | 14.2 | 700 |
| Electrode 2 | 82 | 0.3 | 14.2 | 1000 |

In FIG. 8C, the horizontal axis indicates distance from the facet 12, while the vertical axis indicates distortion generated in the active region 15. Here, positive distortion means tensile distortion.

As is obvious from FIG. 8C, a condition of distortion of the active region 15 changes depending on a difference of stress values of the electrode film 10c. Particularly, when the electrode film stress value is large, the distortion generated in the active region shifts toward the tensile side. Generally, it is known that the band gap is reduced when lattice constant of semiconductor crystal becomes larger, namely depending on generation of tensile distortion in the crystal. Namely, in the semiconductor laser element illustrated in FIG. 8A, the band gap becomes small and the band gap wavelength shifts toward longer wavelength side in the element where tensile stress of electrode film 10c is larger.

As a result, the band gap wavelength of the semiconductor laser element fabricated by the method of this embodiment has been 1574 nm (stress of gold electrode film: 700 MPa) and 1586 nm (stress of gold electrode film: 1400 MPa).

Figure 9A:
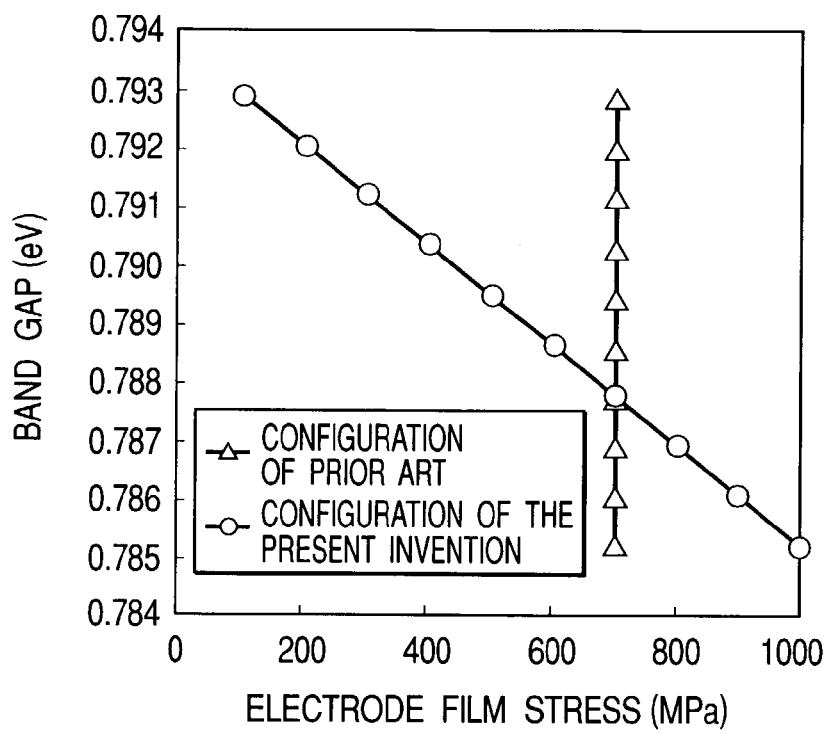
FIG. 9A and FIG. 9B are diagrams illustrating relationships between electrode stress of the semiconductor laser element configuration and band gap of active layer and between electrode stress and band gap wavelength.
Figure 9B:
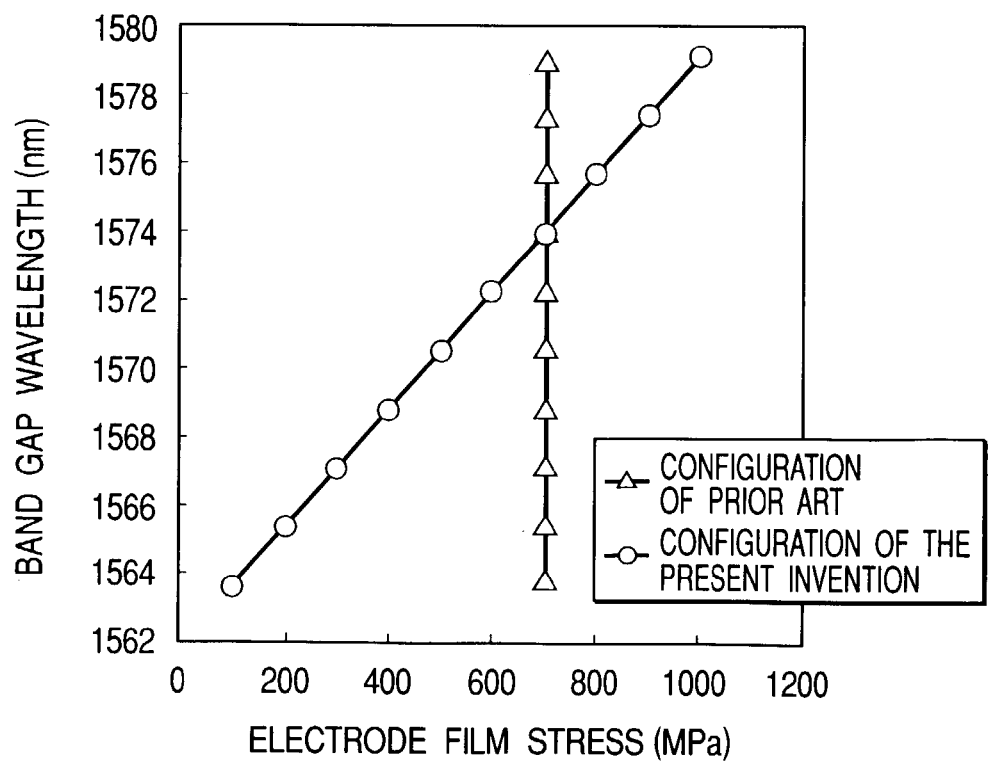

Characteristics of the semiconductor laser element of a preferred embodiment of the present invention will be explained with reference to FIGS. 9A and 9B. FIG. 9A and FIG. 9B respectively illustrate relationships between the electrode film stress and the band gap of the active layer (FIG. 9A) and band gap wavelength (FIG. 9B) of a plurality of electrode laser elements fabricated by the method of present invention and the fabrication method for comparison without control of the present invention. In the comparison example, when a plurality of semiconductor laser elements having different wavelengths are fabricated, band gap is changed by varying composition of the active layer as illustrated in FIG. 6A and band gap wavelength is changed as illustrated in FIG. 6B. Meanwhile, in the semiconductor laser element illustrated in this embodiment, stress of electrode film is changed for varying the band gap and the band gap wavelength of the active layer and it is not particularly required to change the composition of the active layer. Namely, as illustrated in FIG. 9A and FIG. 9B, in comparison with a plurality of semiconductor laser elements, the semiconductor laser element of this embodiment is same in the composition of the active layer but allows a certain correlation between the electrode stress and the band gap of the active layer. Moreover, the same semiconductor laser element also allows correlation between the electrode stress and the band gap wavelength of the active layer.

In other words, according to the method for fabricating the semiconductor laser element of this embodiment, the semiconductor laser element and semiconductor laser module in different band gap wavelengths which can easily vary the band gap wavelength without change of composition of the multiple quantum well active layer can be obtained easily. Therefore, an element which can oscillate the laser beam of longer wavelength can be formed from the active layer of the same composition by making larger the stress of electrode film of one semiconductor laser element than that of the other element (of lower evaporation temperature). Accordingly, the semiconductor laser elements of different wavelengths can be provided.

(Embodiment 3)

Figure 10A:
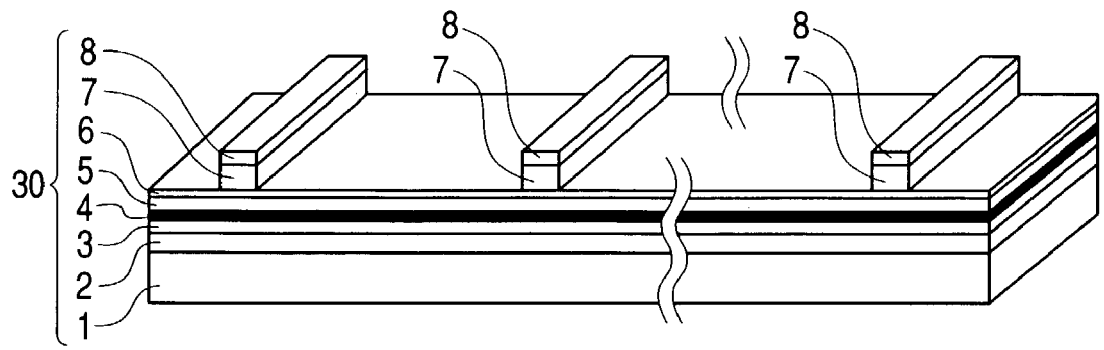
FIG. 10A, FIG. 10B and FIG. 10C are perspective views illustrating a method for fabricating a semiconductor laser element of a third embodiment of the present invention.
Figure 10B:
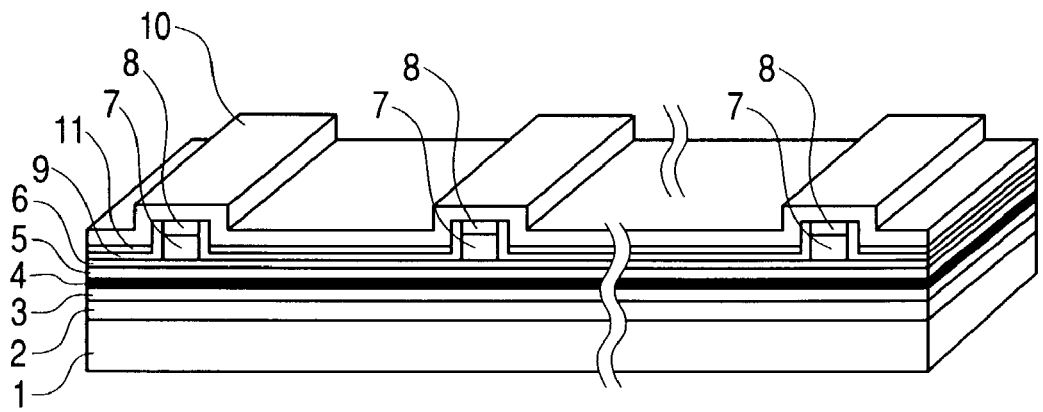
Figure 10C:
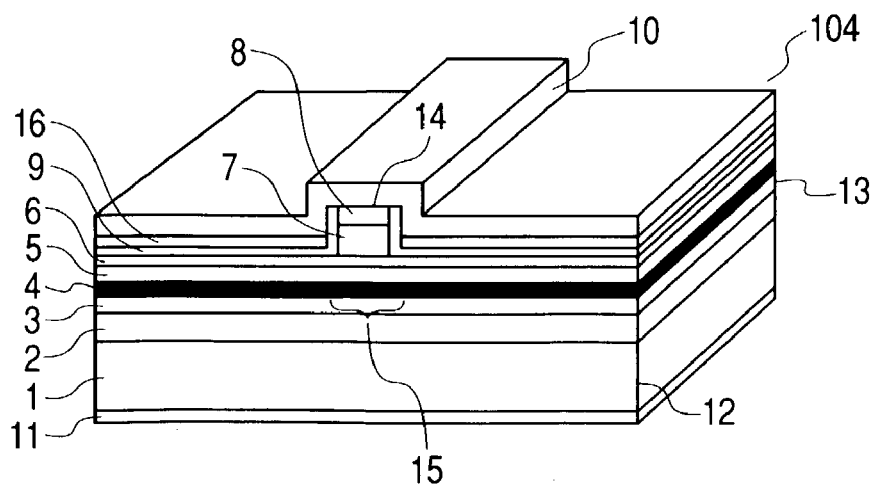
Figure 11A:
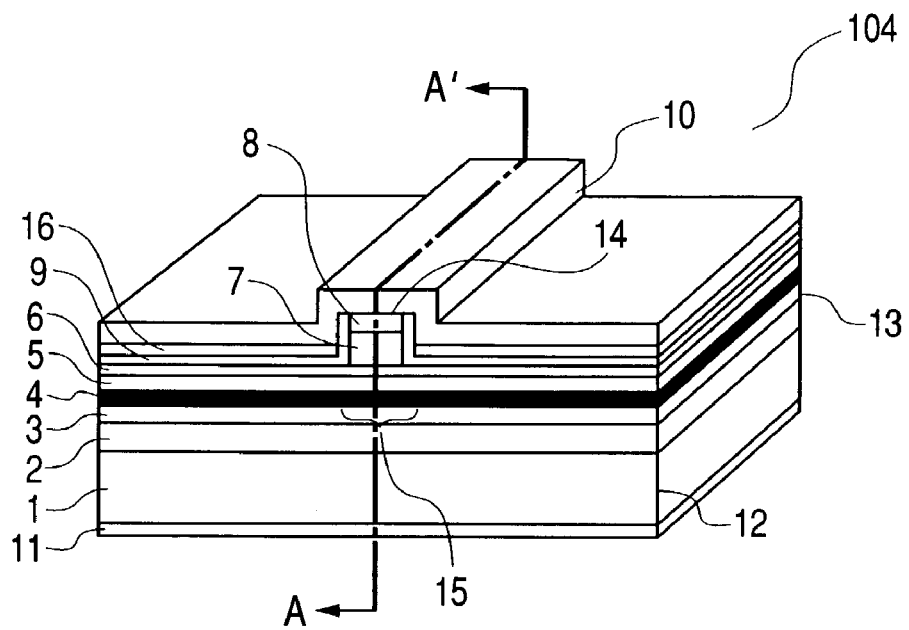
FIG. 11A, FIG. 11B and FIG. 11C are diagram for describing a distortion distribution diagram of the semiconductor laser element of the third embodiment of the present invention.
Figure 11B:
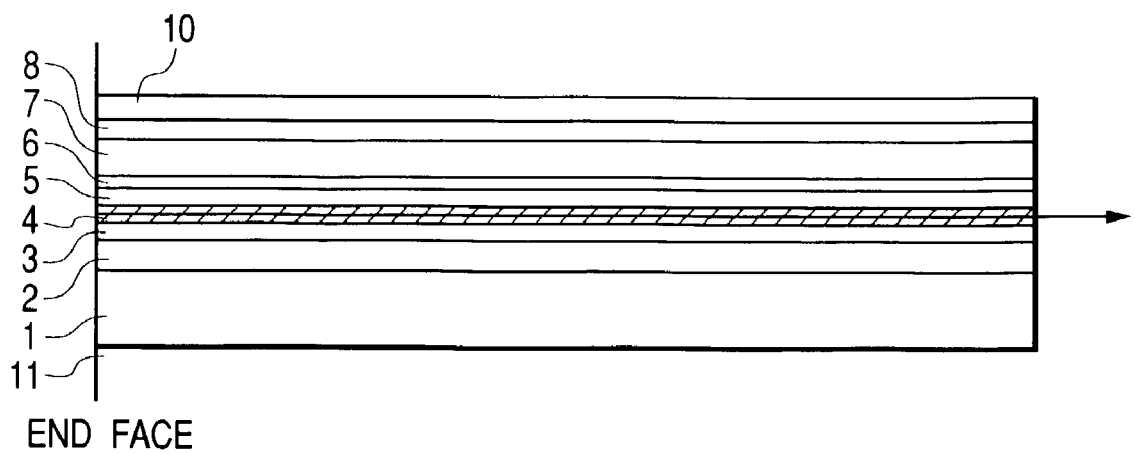
Figure 11C:
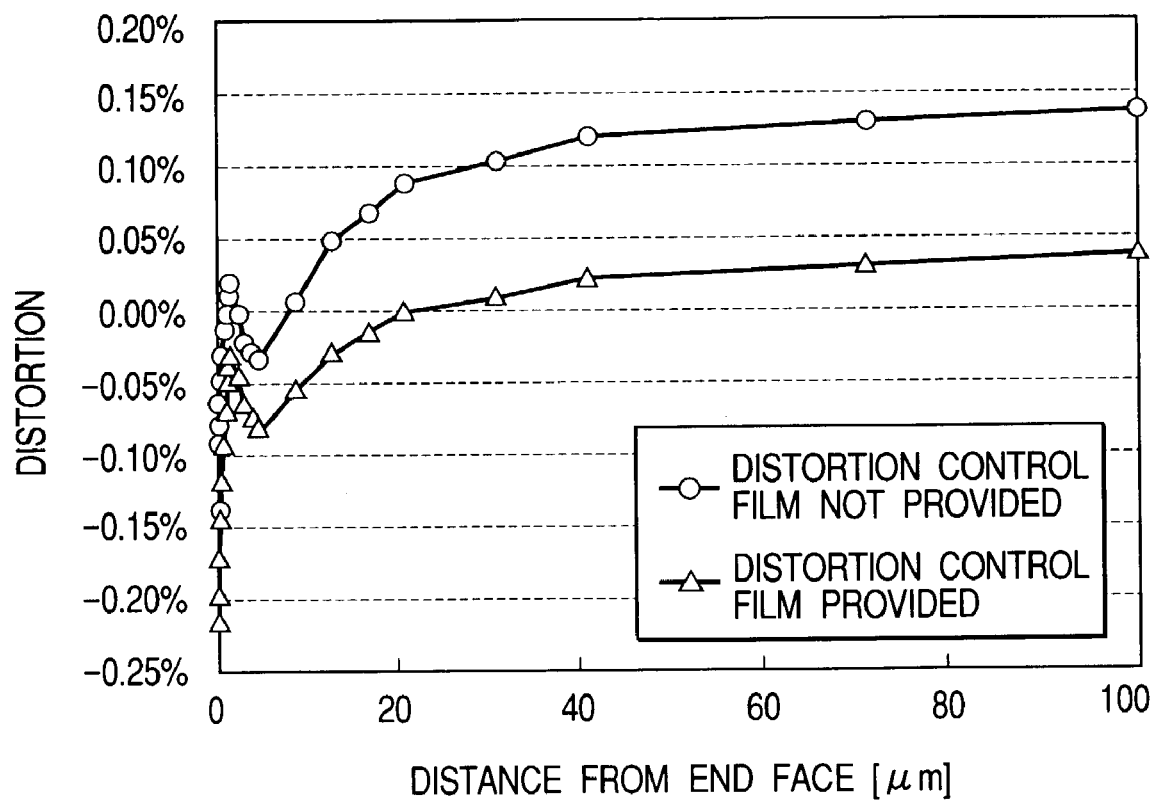

A semiconductor laser element configuration and a method for fabricating the same of a third embodiment of the present invention will be described with reference to FIGS. 10A to 10C and FIGS. 11A to 11C. FIG. 10A to FIG. 10C are perspective views illustrating fabrication processes of the semiconductor laser element of the third embodiment of the present invention. FIG. 11A is a perspective view illustrating an element which can be formed with the method for fabricating the semiconductor laser element of the second embodiment of the present invention. FIG. 11B is a cross-sectional view along the line A–A' of FIG. 11A and FIG. 11C is a diagram illustrating distribution of distortion of the active layer at the facet along the line A–A' of FIG. 11B.

A method for fabricating a semiconductor laser element of a preferred embodiment of the present invention enables fabrication of semiconductor laser element for different wavelengths without change of composition of the multiple quantum well active layer. Difference between the method for fabricating the semiconductor laser element of this embodiment and the method for fabricating the semiconductor laser element of the embodiments 1 and 2 is that the band gap of the active layer and the band gap wavelength are controlled by providing a distortion control film having stress in addition to the electrode film having distortion generated in the active layer.

In the processes for fabrication of semiconductor laser element of the present invention, the buffer layer 2, first clad layer 3, multiple quantum well layer 4, second clad layer 5, etching stop layer 6, third clad layer 7 and cap layer 8 are crystal-grown on the substrate 1 as in the case of FIG. 1A with the MOCVD method. Next, a mesa-configuration (width: 1.6 μm; height: about 2 μm) is formed with the etching process using a resist film as mask (FIG. 10A). Subsequently, an insulation film 9 consisting of a silicon oxide film (thickness: 200 nm) is formed, for example, with a thermal CVD method. This insulation film 9 formed extending from the side surface of mesa-configuration (hereinafter referred to as mesa side surface) to the upper surface of the etching stop layer 6 located at the side of this side surface. Thereafter, the insulation film on the upper surface of mesa-configuration (hereinafter referred to as mesa upper surface) is removed by the etching process.

A distortion control film is formed on the surface of insulation film. This distortion control film 16 is formed on the peripheral area of mesa-configuration (hereinafter referred to as mesa peripheral area). Moreover, this distortion control film 16 can be formed, for example, by forming silicon nitride having stress with the sputtering method. Here, stress of the distortion control film is changed to control distortion generated in the multiple quantum well active layer by varying film forming conditions of the sputtering method (power of sputter, film forming temperature, pressure of argon, or the like). Otherwise, distortion generated in the multiple quantum well active layer can be controlled by varying thickness of the distortion control film.

For example, as the dependence on sputter conditions of stress of silicon nitride film, the silicon nitride film formed under room temperature (25° C.) with argon pressure of $3\times10^{-3}$ Torr and sputter power of 500W shows compression stress of 1500 MPa, while the silicon nitride film formed under room temperature (25° C.) with argon pressure of $3\times10^{-3}$ Torr and sputter power of 900W shows compression stress of 2000 MPa and the silicon nitride film formed under room temperature (25° C.) with argon pressure of $7\times10^{-3}$ Torr and sputter power of 500W shows compression stress of 500 MPa.

Next, an electrode film is formed on the surface of an insulation film and a mesa upper surface. As the electrode film 10d, a gold film (thickness: 500 nm) is formed with the evaporation method over the under-layer consisting of titanium (thickness: 100 nm) and platinum (thickness: 25 nm).

After formation of electrode film, a semiconductor laser element can be obtained through the polishing of a bottom surface of the substrate 1, formation of the electrode to a rear surface of the substrate, formation of facet with clevage and formation of protection film to facet as in the case of the processes of FIG. 1A (FIG. 10C). Moreover, a semiconductor laser module can be configured by mounting a semiconductor laser element like the semiconductor laser module described as the first embodiment.

Next, distribution of distortion generated in the active layer will be described with reference to FIG. 11A to 11C. FIG. 11C illustrates calculation result obtained through the FEM analysis. Here, as the material constants used for the FEM analysis, those of phosphorus indium are used, like the embodiment 1, for the substrate 1, buffer layer 2, first clad layer 3, active layer 4, second clad layer 5, etching stop layer 6, third clad layer 7 and cap layer 8. Actually, the buffer layer 2, clad layers 3, 5, 7, active layers 4, etching stop layer 6 and cap layer 8 are formed of a ternary-element or quaternary-element system material but generality of analysis result is never lost even when the material constants of the binary-element system phosphorus indium is used as the material constants described above. Moreover, the insulation film 9 is composed of silicon oxide (thickness: 200 nm) and stress value is defined as tensile stress of 300 MPa. As the electrode film 10, a gold film (thickness: 250 nm) is formed over the under-layer consisting of titanium (thickness: 100 nm) and platinum (thickness: 25 nm), while stress of electrode film 10 is tensile stress of 700 MPa. Distortion generated in the active layer by the distortion control film is searched by comparing the cases where distortion control film is provided and not provided.

Material constants used for the FEM analysis are listed in the Table 3. In the Table 3, an arrow mark indicates the same as above.

TABLE 3

|  | Young's modulus (Gpa) | Poasson's ratio | Line expansion coefficient (×10⁻⁶/° C.) | Initial stress (MPa) |
| --- | --- | --- | --- | --- |
| Substrate | 104 | 0.3 | 4.56 | 0 |
| Buffer layer | ↑ | ↑ | ↑ | ↑ |
| First clad layer | ↑ | ↑ | ↑ | ↑ |
| Active layer | ↑ | ↑ | ↑ | ↑ |
| Second clad layer | ↑ | ↑ | ↑ | ↑ |
| Etching stop layer | ↑ | ↑ | ↑ | ↑ |
| Third clad layer | ↑ | ↑ | ↑ | ↑ |
| Insulation film | 70 | 0.17 | 0.6 | 300 |
| Distortion control film | 260 | 0.26 | 2.5 | −1500 |
| Electrode | 82 | 0.3 | 14.2 | 700 |

In FIG. 11C, the horizontal axis indicates distance from the facet 12, while the vertical axis indicates distortion generated in the active region 15. Here, positive distortion indicates tensile distortion.

As is apparent from FIG. 11C, condition of distortion of active region 15 changes depending on existence of the distortion control film. When the distortion control film having compression stress is provided, distortion generated in the active region shifts toward the compression side.

As a result, distortion has been about 0.13% when the distortion control film having compression stress is not provided, while distortion has been about 0.03% when the distortion control film having such compression stress is provided.

In general, it is well known that the band gap becomes larger when lattice constant of the semiconductor crystal becomes smaller, namely depending on generation of compression distortion in the crystal. Namely, in the semiconductor laser element illustrated in FIG. 11A, the band gap becomes larger and the band gap wavelength shifts toward the short wavelength side in the element where the distortion control film is provided.

As a result, the band gap wavelength of the semiconductor laser element fabricated by the method of present invention has been 1564 nm (configuration without distortion control film) and 1572 nm (configuration without distortion control film).

(Embodiment 4)

Figure 12A:
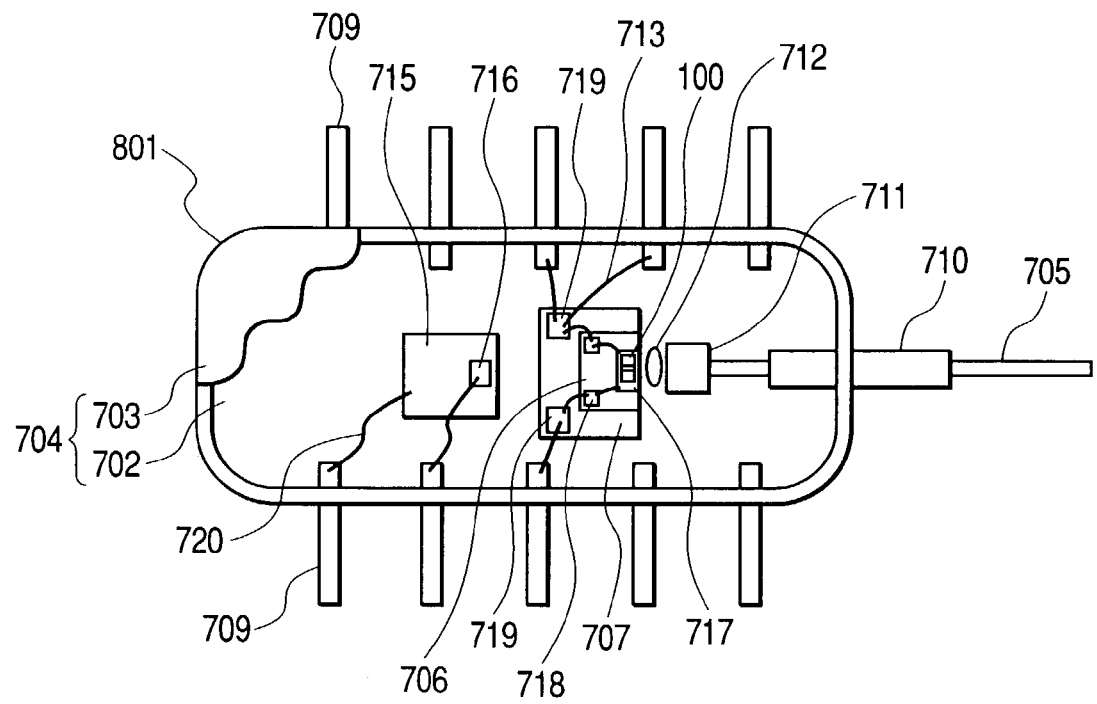
FIG. 12A and FIG. 12B are diagrams illustrating a semiconductor laser module of a fourth embodiment of the present invention.
Figure 12B:
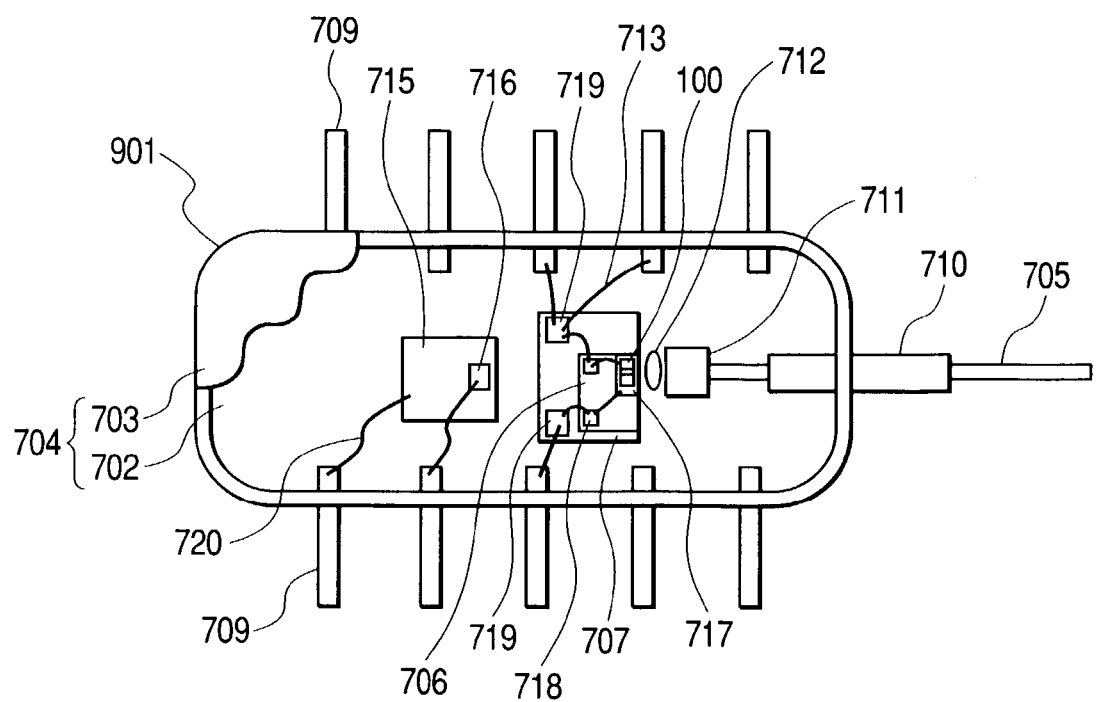
Figure 13A:
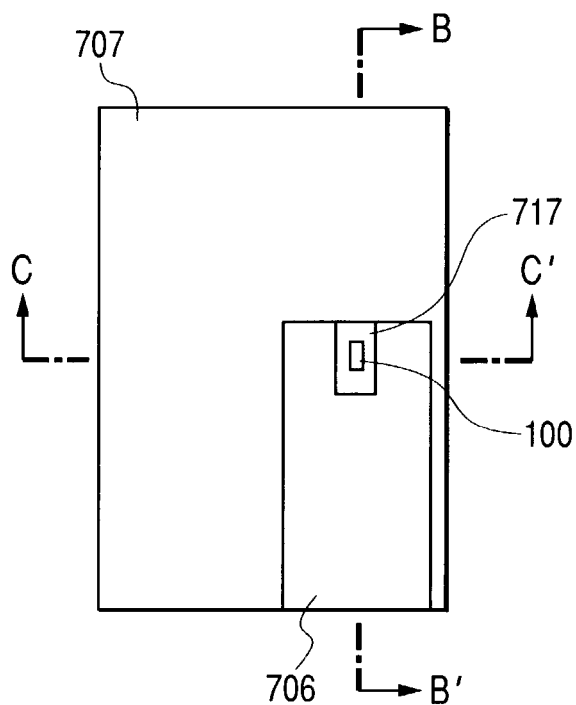
FIG. 13A, FIG. 13B and FIG. 13C are enlarged diagrams of the essential portion of the semiconductor laser module of the fourth embodiment of the present invention.
Figure 13B:
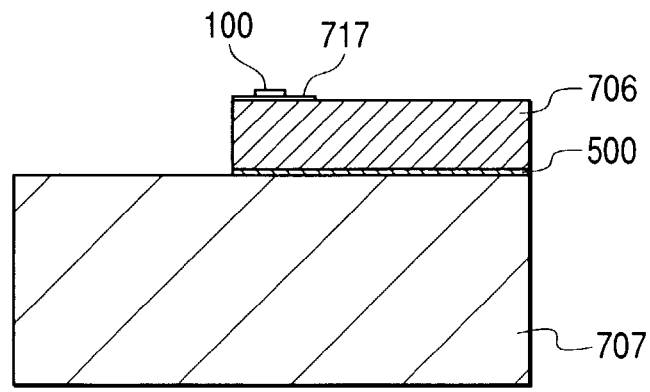
Figure 13C:
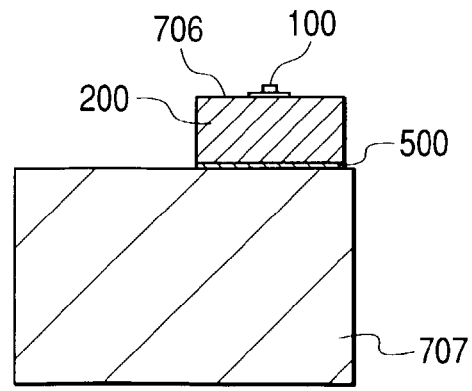
Figure 14A:
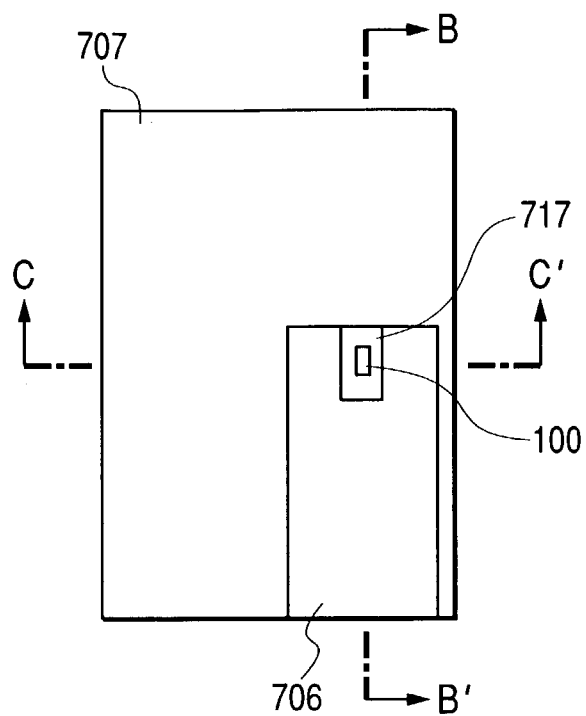
FIG. 14A, FIG. 14B and FIG. 14C are enlarged diagrams of the essential portion of the semiconductor laser module of the fourth embodiment of the present invention.
Figure 14B:
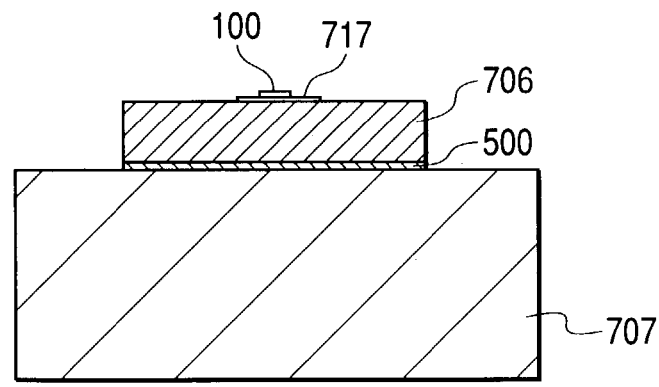
Figure 14C:
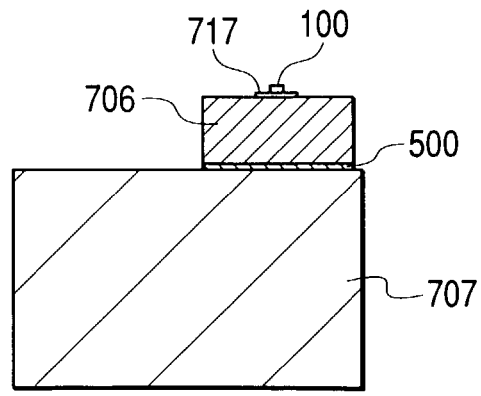

A semiconductor laser element module of a fourth embodiment of the present invention will be described with reference to FIGS. 12A and 12B to FIGS. 14A to 14C. FIGS. 12A and 12B are plan views of the essential portion of a semiconductor laser module wherein the semiconductor laser element of the present invention is mounted to a package via a chip carrier and a stem. FIGS. 13A and FIG. 14A are enlarged view of the semiconductor laser element, the chip carrier and the stem of the semiconductor laser module illustrated in FIGS. 12A and 12B. Moreover, FIG. 13B and FIG. 14B are respectively cross-sectional views along the line B–B' of FIG. 13A and FIG. 14A. Further, FIG. 13C and FIG. 14C respectively illustrate cross-sectional views along the line C–C' of FIG. 13A and FIG. 14A. The semiconductor laser modules 801 and 901 of this embodiment comprise, as illustrated in FIGS. 12A and 12B, a package 704 consisting of a package body 702 and a cover body 703 and an optical cable 705 (optical fiber) extending over the internal and external sides of this package 704. In addition, on the upper surface of central area of the package body 701, the semiconductor laser element 100 fabricated by the method described later is deposited and fixed via the chip carrier 706 and the stem 707.

In both sides of the package body 702, a plurality of electrode terminals 709 are allocated to form a package with electrode terminals. These electrode terminals 709 are extending over the internal and external sides of the package body 702. The optical cable 705 is inserted into a guide pipe 710 provided through the package body 702 and is also fixed with a bonding material not illustrated. The end part of the optical cable 705 is connected optically to an isolator 711. A lens 712 is allocated between this isolator 711 and a laser emitting surface of the semiconductor laser element 100.

Here, the semiconductor laser element modules 801 and 901 are different from each other in the mounting position of semiconductor laser element 100 for the chip carrier 706 and in the mounting position of chip carrier 706 for the stem 707. These mounting positions will be described in detail with reference to FIGS. 12A and 12B and FIGS. 13A, 13B and 13C. As illustrated in these FIGS. 12A to 12B and FIGS. 13A to 13C, the semiconductor laser element 100 and chip carrier 706 are joined with a solder material 717, while the chip carrier 706 and stem 707 are joined with a solder material 500. The semiconductor laser element 100 is a mesa type semiconductor laser element described in above embodiments or an embedded type semiconductor laser element. Moreover, the chip carrier 706 is formed, for example, of silicon (4 mm×2 mm×thickness of 1 mm), while the stem 707 is formed, for example, of copper tungsten (7 mm×7 mm×thickness of 3 mm). Further, the solder materials 717 and 500 are respectively formed of gold-tin and lead-tin solder materials. The chip carrier 706 and stem 707 mounting the semiconductor laser element 100 are joined when these are heated to more than the melting point of 183° C. of solder material 500 and are then cooled to the room temperature.

Here, composition of active layer of the semiconductor laser element 100 is identical in the semiconductor laser element modules 801 and 901 illustrated in FIGS. 12A and 12B but the mounting position on the chip carrier 706 of semiconductor laser element 100 is different therein. For example, the semiconductor laser element 100 is mounted at the central area on the chip carrier 706 in the semiconductor laser element module 801, while it is mounted at the position displaced from the central area of the chip carrier 706. Moreover, the mounting position of chip carrier 706 on the stem 707 is different. Positional relationship between the semiconductor laser element 100 and the stem 707 of the semiconductor laser element modules 801 and 901 is allowed to be different but the semiconductor laser element 100 is allocated at the central position of the upper part of the stem 707 in this embodiment.

Since the mounting position of the chip carrier 706 on the stem 707 is different in the semiconductor element modules 801 and 901 of this embodiment, distribution of thermal stress generated when the solder material 500 is joined is different in these modules. Accordingly, distribution of distortion of the semiconductor laser element 100 mounted on the chip carrier 706 is also different in the semiconductor laser element modules 801 and 901.

In more practical, regarding distortion generated in the active layer of the semiconductor laser element, a value of the semiconductor laser element module 901 is shifted toward tensile distortion side in comparison with the semiconductor laser element module 801. Thereby, regarding the band gap of the active layer, a value of the semiconductor laser module 901 becomes small in comparison with the semiconductor laser element module 801 and the band gap wavelength is shifted toward the short-wavelength side.

As a result, the band gap wavelength of semiconductor laser element fabricated by the method of this embodiment has been 1410 nm (semiconductor laser element module 901) and 1400 nm (semiconductor laser module 801). Namely, it has become possible to oscillate different band gap wavelengths without change of composition of the multiple quantum well active layer, by varying the mounting positions of the semiconductor laser element and the chip carrier on the stem.

In other words, larger compression distortion can be applied to the element by isolating mounting position to the semiconductor laser element far from the facet of chip carrier (namely, allocated nearer to the central area of chip carrier). Thereby, an element which can expand band gap and oscillate laser beam of short-wavelength can be formed. Likely, when thickness of the chip carrier is increased, tensile distortion may be applied more easily and thereby an element which can oscillates the laser beam of longer wavelength can be formed. As described above, laser devices which can generate various oscillation wavelengths in different layouts can be formed by utilizing the semiconductor laser element comprising the active layer of substantially same composition.

(Embodiment 5)

A semiconductor laser element module of a fifth embodiment of the present invention will be described with reference to FIG. 15 and FIGS. 16A to 16C.

Figure 15:
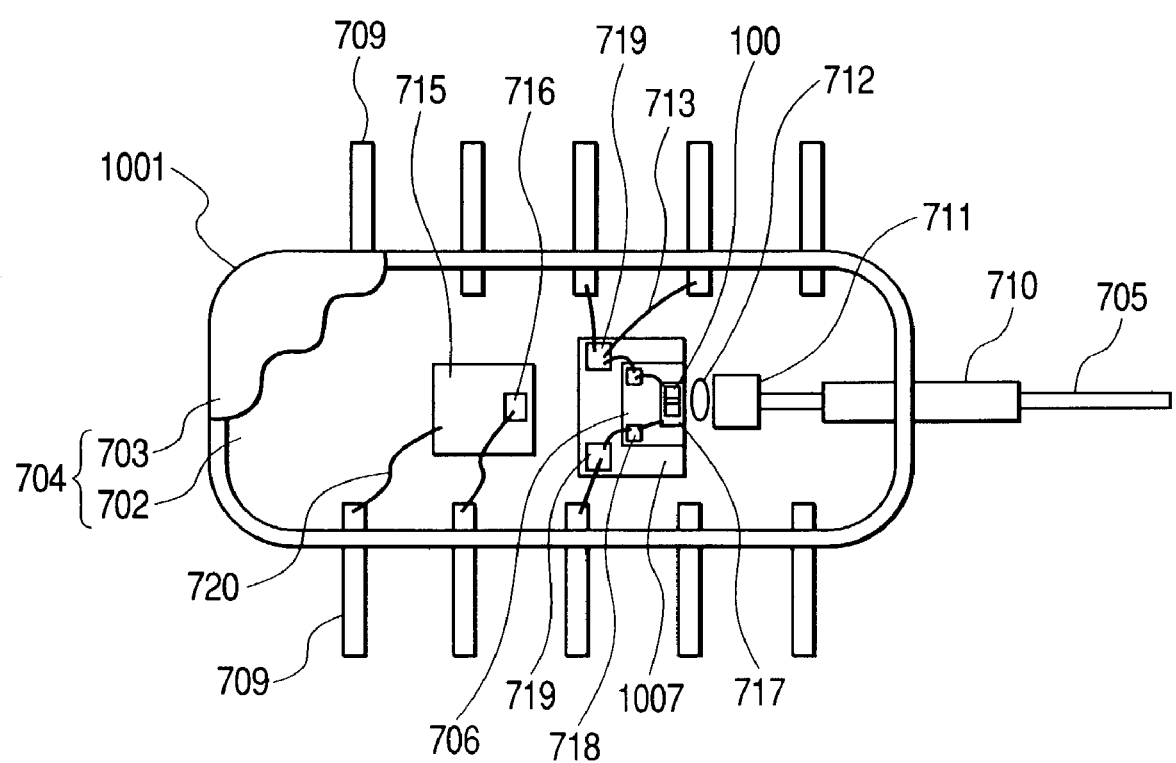
FIG. 15 is a diagram illustrating a semiconductor laser module of a fifth embodiment of the present invention.
Figure 16A:
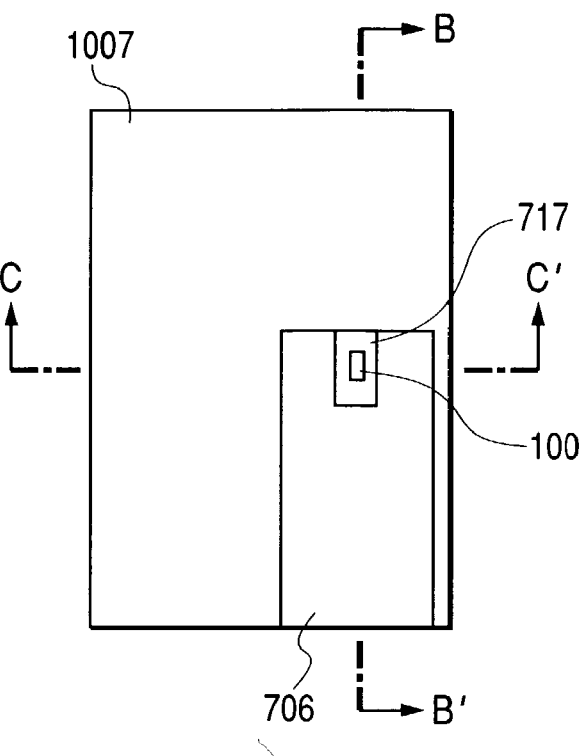
FIG. 16A, FIG. 16B and FIG. 16C are enlarged diagrams of the essential portion of the semiconductor laser module of the fifth embodiment of the present invention.
Figure 16B:
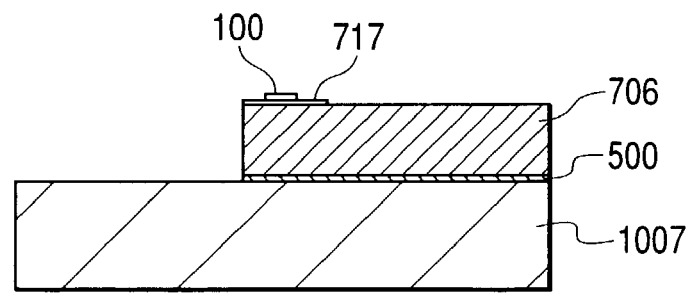
Figure 16C:
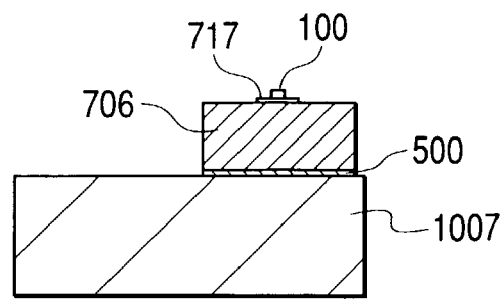

FIG. 15 is a plan view of the essential portion of the semiconductor laser module mounting the semiconductor laser element of the present invention to the package via the chip carrier and stem. FIG. 16A is an enlarged view of the semiconductor laser element, chip carrier and the stem in the semiconductor laser module of FIG. 15. Moreover, FIG. 16B is a cross-sectional view along the line B–B' of FIG. 16A. FIG. 16C is a cross-sectional view along the line C–C' of FIG. 16A.

The semiconductor laser element module 1001 of FIG. 15 comprises the semiconductor laser element 100, chip carrier 706 and stem 1007. The semiconductor laser element 100 and chip carrier 706 are joined with the solder material 717, while the chip carrier 706 and stem 1007 are joined with the solder material 500. The semiconductor laser element 100 is the mesa type semiconductor laser element or embedded type semiconductor laser element described in above embodiments. Moreover, configurations of the other members are similar to those of the semiconductor laser element module 801 described in the embodiment 4.

Here, the semiconductor laser element module 1001 and the semiconductor laser element module 801 described as the embodiment 4 are similar in the composition of active layer of the semiconductor laser element 100 but are different in the thickness of stems 1007 and 707. Thickness of stem 1007 is smaller than that of stem 707. For instance, thickness of the stem 707 is 3 mm but thickness of stem 1007 is 1.5 mm. Therefore, distribution of thermals stress generated when the solder material 500 is joined. Accordingly, distribution of distortion of the semiconductor laser element 100 mounted on the chip carrier 706 is also different in the semiconductor laser element modules 801 and 1001.

In more practical, regarding distortion generated in the active layer of semiconductor laser element, a value of the semiconductor laser element module 1001 is shifted toward tensile distortion side in comparison with the semiconductor laser element module 801. Accordingly, regarding the band gap of the active layer, a value of the semiconductor laser element module 1001 becomes smaller than that of the semiconductor laser element module 801 and the band gap wavelength is shifted toward the long-wavelength side. Similar tendency can also be attained by varying thickness of the chip carrier.

As a result, the band gap wavelength of the semiconductor laser element fabricated by the method of this embodiment has been 1400 nm (semiconductor laser element module 801) and 1410 nm (semiconductor element module 1001). Namely, the semiconductor laser element of this embodiment can oscillate different band gap wavelengths without change of composition of the multiple quantum well active layer by varying the mounting positions of the semiconductor laser element and the chip carrier on the stem.

According to the invention, there is provided the method for fabricating the semiconductor laser elements which can effectively control the oscillation wavelength and the method for fabricating the semiconductor laser modules.

What is claimed is:

1. A method for fabricating a semiconductor laser element comprising the steps of:
   providing a semiconductor substrate;
   forming an active layer of a first composition to oscillate laser beam to said semiconductor substrate; and
   forming an electrode film over said active layer, wherein:
   said method further comprises the step of controlling, after formation of said active layer, distortion of said active layer, so that said active layer generates predetermined distortion corresponding to an oscillation wavelength.

2. A method for fabricating a semiconductor laser element comprising the steps of:
   providing a semiconductor substrate;
   forming an active layer of a first composition to oscillate laser beam to said semiconductor substrate;
   forming a projecting mesa-configuration projected from circumference on said active layer;
   forming an electrode film having tensile stress to an area including the upper surface of said mesa-configuration, wherein:
   said step of forming said electrode film includes a step of setting the thickness thereof predetermined corresponding to an oscillation wavelength.

3. A method for fabricating a semiconductor laser element comprising the steps of:
   providing a semiconductor substrate;
   forming an active layer of a first composition for oscillating laser beam to said semiconductor substrate;
   forming a projecting mesa-configuration projected from circumference on said active layer;
   forming insulation films to the areas sandwiching said mesa-configuration from both sides;
   forming an electrode film having tensile stress to an area including the upper surface of said mesa-configuration and an upper part of said film;
   wherein:
   said step of forming said electrode film includes a step of setting the thickness thereof predetermined corresponding to an oscillation wavelength.

4. A method for fabricating a semiconductor laser element comprising the steps of:
   providing a semiconductor substrate;
   forming an active layer of a first composition to oscillate laser beam to said semiconductor substrate;
   forming a projecting mesa-configuration projected from circumference on said active layer;
   forming insulation films to the areas sandwiching said mesa-configuration from both sides;
   forming distortion control films on said insulation films;
   forming an electrode film having tensile stress to an area including the upper surface of said mesa-configuration and upper part of said insulation film;
   wherein:
   said step of forming said distortion control film includes a step of setting thickness predetermined corresponding to an oscillation wavelength.

5. A method for fabricating a semiconductor laser module comprising the steps of:
   forming semiconductor laser element; and
   providing said laser element to a chip carrier via a joining member, wherein:
   said step of forming said semiconductor laser element further comprises the steps of providing semiconductor substrate, forming an active layer of a first composition to oscillate laser beam to said semiconductor substrate, and forming an electrode film having tensile stress to the upper part of said active layer; and
   said step of providing said laser element to said chip carrier includes a step of adjusting the element position in the distance from the facet of said chip carrier predetermined corresponding to an oscillation wavelength.

6. A method for fabricating a semiconductor laser module comprising the steps of:
   forming semiconductor laser element; and
   providing said semiconductor laser element to a chip carrier via a joining member; wherein:
   said step of forming said semiconductor laser element comprises the steps of providing a semiconductor substrate, forming an active layer of a first composition to oscillate laser beam to said semiconductor substrate, and forming an electrode film having tensile stress to the upper part of said active layer; and
   said step of providing said semiconductor laser element to said chip carrier includes a step of providing said semiconductor laser element to said chip carrier of the thickness predetermined corresponding to an oscillation wavelength.

7. A method for fabricating a semiconductor laser element comprising the steps of:
   providing semiconductor substrate;
   forming an active layer for oscillating laser beam to said semiconductor substrate;
   forming an insulation film at the upper side of said active layer; and
   forming an electrode film to an area including an upper part of said insulation film on the upper side of said insulation film;
   said method further comprising the steps of:
   providing on a first semiconductor substrate a first semiconductor laser element having a first wavelength by forming electrode film or insulation film of a first thickness after formation of said active layer of the first composition; and
   providing on a second semiconductor substrate a second semiconductor laser element having a second wavelength by forming electrode film or insulation film of a second thickness which is thicker than said first thickness after formation of said active layer of the first composition.

* * * * *